United States Patent
Yun et al.

(10) Patent No.: US 10,244,643 B1
(45) Date of Patent: Mar. 26, 2019

(54) DISPLAY DEVICE

(71) Applicant: LG ELECTRONICS INC., Seoul (KR)

(72) Inventors: Hyungkwon Yun, Seoul (KR); Hyunjung Kang, Seoul (KR); Sangtae Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/799,574

(22) Filed: Oct. 31, 2017

(30) Foreign Application Priority Data

Sep. 26, 2017 (WO) ................. PCT/KR2017/010640

(51) Int. Cl.
| H05K 5/00 | (2006.01) |
| H01L 51/52 | (2006.01) |
| H05K 5/02 | (2006.01) |
| H05K 5/03 | (2006.01) |

(52) U.S. Cl.
CPC ....... *H05K 5/0017* (2013.01); *H01L 51/5246* (2013.01); *H05K 5/0221* (2013.01); *H05K 5/03* (2013.01); *H01L 51/5206* (2013.01); *H01L 51/5234* (2013.01); *H01L 2251/308* (2013.01)

(58) Field of Classification Search
CPC ...... H05K 5/0017; H05K 5/0221; H05K 5/03; F16M 13/02; F16M 11/048; H01L 51/5246
See application file for complete search history.

(56) References Cited

U.S. PATENT DOCUMENTS

| 2006/0266898 A1* | 11/2006 | Lin | F16M 13/02 248/220.21 |
| 2007/0194191 A1* | 8/2007 | Persson | F16M 13/02 248/225.11 |
| 2010/0090569 A1 | 4/2010 | Huang | |
| 2011/0017888 A1* | 1/2011 | Sangiuliano | F16M 11/04 248/222.14 |
| 2012/0061541 A1* | 3/2012 | Huang | F16M 13/02 248/274.1 |
| 2013/0256487 A1* | 10/2013 | Ko | F16M 13/02 248/231.91 |
| 2014/0166834 A1* | 6/2014 | Kuroyanagi | F16M 13/02 248/231.91 |
| 2017/0204615 A1* | 7/2017 | Gulnick | E04F 13/0803 |

FOREIGN PATENT DOCUMENTS

| KR | 20-2000-0005759 U | 4/2000 |
| KR | 10-2000-0075331 A | 12/2000 |
| KR | 10-2002-0061978 A | 7/2002 |
| KR | 10-1710188 B1 | 2/2017 |

\* cited by examiner

*Primary Examiner* — Hoa C Nguyen
*Assistant Examiner* — Christopher L Augustin
(74) *Attorney, Agent, or Firm* — Birch, Stewart, Kolasch & Birch, LLP

(57) ABSTRACT

A display device can include a display panel; a module cover disposed at a rear of the display panel and coupled to the display panel; a plate disposed at a rear of the module cover; a bracket disposed between the module cover and the plate, and fixed to the plate; and a coupling unit fixing the bracket to the module cover, in which the coupling unit includes a latch disposed at a rear surface of the module cover, and a fixing pin mounted on the bracket and coupled to the latch.

16 Claims, 29 Drawing Sheets

DISPLAY DEVICE

This application claims the benefit of International Application No. PCT/KR2017/010640 filed on Sep. 26, 2017, the entire contents of which are incorporated herein by reference for all purposes as if fully set forth herein.

BACKGROUND OF THE INVENTION

Field of the Invention

The present disclosure relates to a display device.

Discussion of the Related Art

With the development of the information society, various demands for display devices have been increasing. Various display devices, such as, e.g., liquid crystal displays (LCDs), plasma display panels (PDPs), electroluminescent displays (ELDs), and vacuum fluorescent displays (VFDs), have been studied and used to meet various demands for the display devices.

Among the display devices, an organic light emitting diode (OLED) display using organic light emitting diodes has advantages of a higher luminance and a wider viewing angle than a liquid crystal display. In addition, the OLED display has an advantage of an ultra-thin profile because it does not require a backlight unit.

Recently, many studies have been made on an assembly structure of the display devices.

SUMMARY OF THE INVENTION

Accordingly, an object of the present disclosure is to address the above-described and other problems.

Another aspect of the present disclosure is to provide a display device capable of firmly fixing a head to a plate using a latch on a module cover and a fixing pin on a bracket.

In one aspect, there is provided a display device comprising a display panel, a module cover positioned in a rear of the display panel and coupled to the display panel, a plate positioned in a rear of the module cover, a bracket positioned between the module cover and the plate and fixed to the plate, and a coupling unit fixing the bracket to the module cover, in which the coupling unit includes a latch positioned at a rear surface of the module cover, and a fixing pin mounted on the bracket and coupled to the latch.

According to another aspect of the present disclosure, the latch includes a first latch and a second latch that face each other, and an accommodating hole positioned between the first latch and the second latch and accommodating the fixing pin.

According to another aspect of the present disclosure, the bracket includes a body, a pin housing between the body and the plate, the pin housing being formed by recessing one surface of the body, and a pin hole penetrating the pin housing. The fixing pin is disposed in an internal space of the pin housing, and a portion of the fixing pin is expressed by the pin hole.

According to another aspect of the present disclosure, the pin housing includes at least one pin fixing protrusion in the internal space. The fixing pin is adjacent to the pin fixing protrusion and is mounted in the internal space.

According to another aspect of the present disclosure, the fixing pin includes an elastic portion accommodated in the internal space and formed in a circular shape in which a portion is opened, a transfer portion accommodated in the internal space and extended from both ends of the opened portion of the elastic portion, and a fastening portion extended from the transfer portion in a direction toward the module cover and bent one or more times, in which the fastening portion is not accommodated in the internal space.

According to another aspect of the present disclosure, the fastening portion is positioned adjacent to the accommodating hole.

According to another aspect of the present disclosure, the first latch and the second latch are positioned in the pin hole.

According to another aspect of the present disclosure, when the bracket is mounted on the module cover, a width of the fastening portion is greater than a width between an end of the first latch and an end of the second latch.

According to another aspect of the present disclosure, the latch includes a first latch and a second latch that face each other in opposite directions. The module cover includes a first accommodating hole positioned adjacent to the first latch and accommodating the fixing pin, and a second accommodating hole spaced apart from the first latch and the first accommodating hole, positioned adjacent to the second latch, and accommodating the fixing pin. The first latch and the second latch are disposed between the first accommodating hole and the second accommodating hole.

According to another aspect of the present disclosure, the bracket includes a body, a pin housing between the body and the plate, the pin housing being formed by recessing one surface of the body, and a pin hole penetrating the pin housing. The fixing pin is disposed in an internal space of the pin housing, and a portion of the fixing pin is expressed by the pin hole.

According to another aspect of the present disclosure, the pin housing includes at least one pin fixing protrusion in the internal space. The fixing pin is adjacent to the pin fixing protrusion and is mounted in the internal space.

According to another aspect of the present disclosure, the fixing pin includes an elastic portion accommodated in the internal space and formed in a circular shape in which a portion is opened, a transfer portion accommodated in the internal space and extended from both ends of the opened portion of the elastic portion, a support portion accommodated in the internal space and spaced apart from the transfer portion, and a fastening portion extended from the transfer portion and the support portion in a direction toward the plate and having a curved shape connecting the transfer portion and the support portion, in which the fastening portion is not accommodated in the internal space.

According to another aspect of the present disclosure, the fastening portion is positioned adjacent to the first accommodating hole and the second accommodating hole.

According to another aspect of the present disclosure, the first latch and the second latch are positioned in the pin hole.

According to another aspect of the present disclosure, when the bracket is mounted on the module cover, a width of the fastening portion is less than a width between an end of the first latch and an end of the second latch.

According to another aspect of the present disclosure, the display device further comprises an adhesive member fixed to a front surface of the plate and attached to the bracket.

According to at least one aspect of the present disclosure, the present disclosure can firmly fix a head to the plate using the latch on the module cover and the fixing pin on the bracket.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
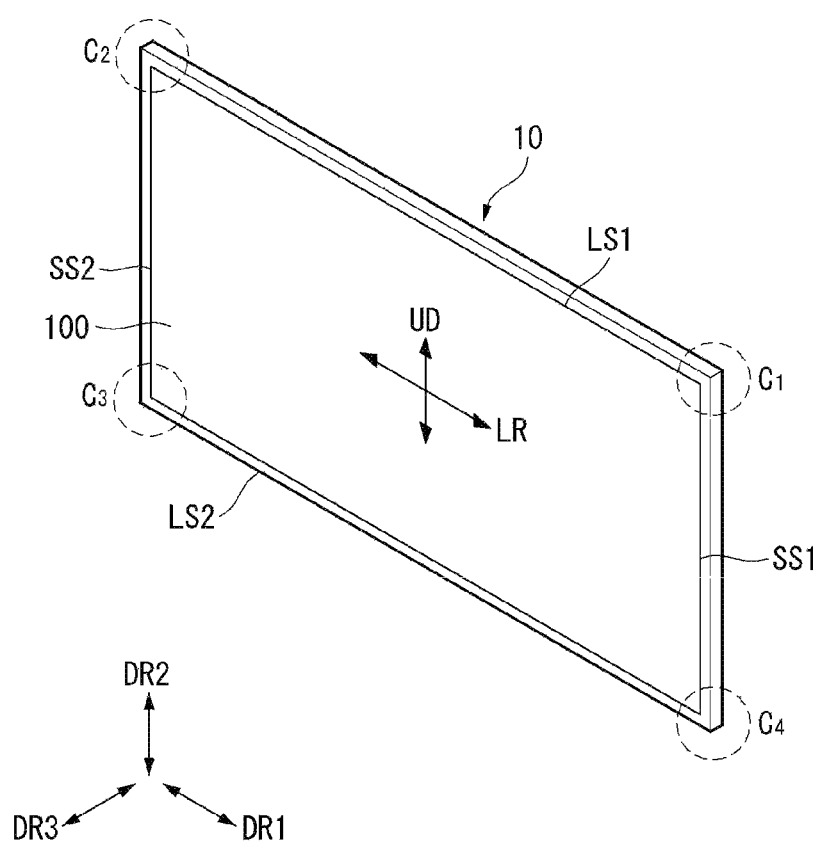
FIGS. 1 to 5 illustrate examples of a display device related to the present disclosure according to embodiments.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms "first," "second," etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, embodiments of the disclosure are described using an organic light emitting diode (OLED) display panel as an example of a display panel. Other display panels may be used. For example, a plasma display panel (PDP), a field emission display (FED) panel, and a liquid crystal display panel may be used.

Referring to FIG. 1, a display panel 100 or a head 10 can include a first long side LS1, a second long side LS2 opposite the first long side LS1, a first short side SS1 adjacent to the first long side LS1 and the second long side LS2, and a second short side SS2 opposite the first short side SS1.

In embodiments disclosed herein, the first short side SS1 may be referred to as a first side area; the second short side SS2 may be referred to as a second side area opposite the first side area; the first long side LS1 may be referred to as a third side area that is adjacent to the first side area and the second side area and is positioned between the first side area and the second side area; and the second long side LS2 may be referred to as a fourth side area that is adjacent to the first side area and the second side area, is positioned between the first side area and the second side area, and is opposite to the third side area.

Embodiments of the disclosure describe and illustrate that lengths of the first and second long sides LS1 and LS2 are longer than lengths of the first and second short sides SS1 and SS2 for convenience of explanation. However, the lengths of the first and second long sides LS1 and LS2 can be almost equal to the lengths of the first and second short sides SS1 and SS2.

In the following description, a first direction DR1 can be a direction parallel to the long sides LS1 and LS2 of the display panel 100, and a second direction DR2 can be a direction parallel to the short sides SS1 and SS2 of the display panel 100. Further, a third direction DR3 can be a direction perpendicular to the first direction DR1 and/or the second direction DR2.

In another point of view, a side or a surface, on which the head 10 of a display device displays an image, may be referred to as a front side or a front surface. When the head 10 of the display device displays the image, a side or a surface, at which the image cannot be observed, may be referred to as a rear side or a rear surface. When the head 10 of the display device is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

The first long side LS1, the second long side LS2, the first short side SS1, and the second short side SS2 may be referred to as edges of the head 10 of the display device. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as a left-right direction. A direction from the first long side LS1 to the second long side LS2 or from the second long side LS2 to the first long side LS1 may be referred to as an up-down direction.

Figure 2:
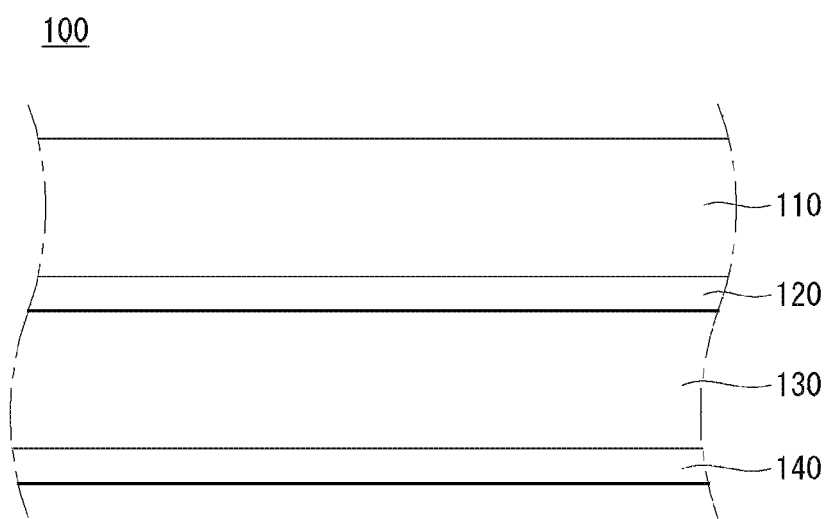

Referring to FIG. 2, the display panel 100 can include a transparent substrate 110, an upper electrode 120, an organic light emitting layer 130, and a lower electrode 140. The transparent substrate 110, the upper electrode 120, the organic light emitting layer 130, and the lower electrode 140 can be sequentially formed or stacked.

The transparent substrate 110 and the upper electrode 120 can include a transparent material, for example, indium tin oxide (ITO). The lower electrode 140 can include a non-transparent material. However, embodiments are not limited thereto. The lower electrode 140 can include a transparent material, for example, indium tin oxide (ITO). In this instance, light can be emitted to a surface of the lower electrode 140.

When a voltage is applied to the upper electrode 120 and lower electrode 140, light emitted from the organic light emitting layer 130 can be transmitted by the upper electrode 120 and the transparent substrate 110 and can be emitted to the outside. In this instance, a light shielding plate can be further formed behind the lower electrode 140, in order to emit forward light emitted to the lower electrode 140.

For example, the display device according to the embodiment of the disclosure can be an organic light emitting diode (OLED) display. An active matrix OLED display includes organic light emitting diodes (OLEDs) capable of emitting light by themselves and has advantages of a fast response time, high emission efficiency, a high luminance, and a wide viewing angle.

The OLED serving as a self-emitting element can include an anode electrode, a cathode electrode, and an organic compound layer between the anode electrode and the cathode electrode. The organic compound layer can include a hole injection layer, a hole transport layer, an emission layer, an electron transport layer, and an electron injection layer. When a driving voltage is applied to the anode electrode and the cathode electrode, holes passing through the hole transport layer and electrons passing through the electron transport layer move to the emission layer to form hole-electron pairs, i.e., excitons. As a result, the emission layer can generate visible light.

The OLED display has an advantage in reducing volume and weight because it does not separately require a light source. In addition, because the OLED display has a response time that is more than 1,000 times faster than a liquid crystal display, the OLED display may not generate image sticking when displaying an image.

Figure 3:
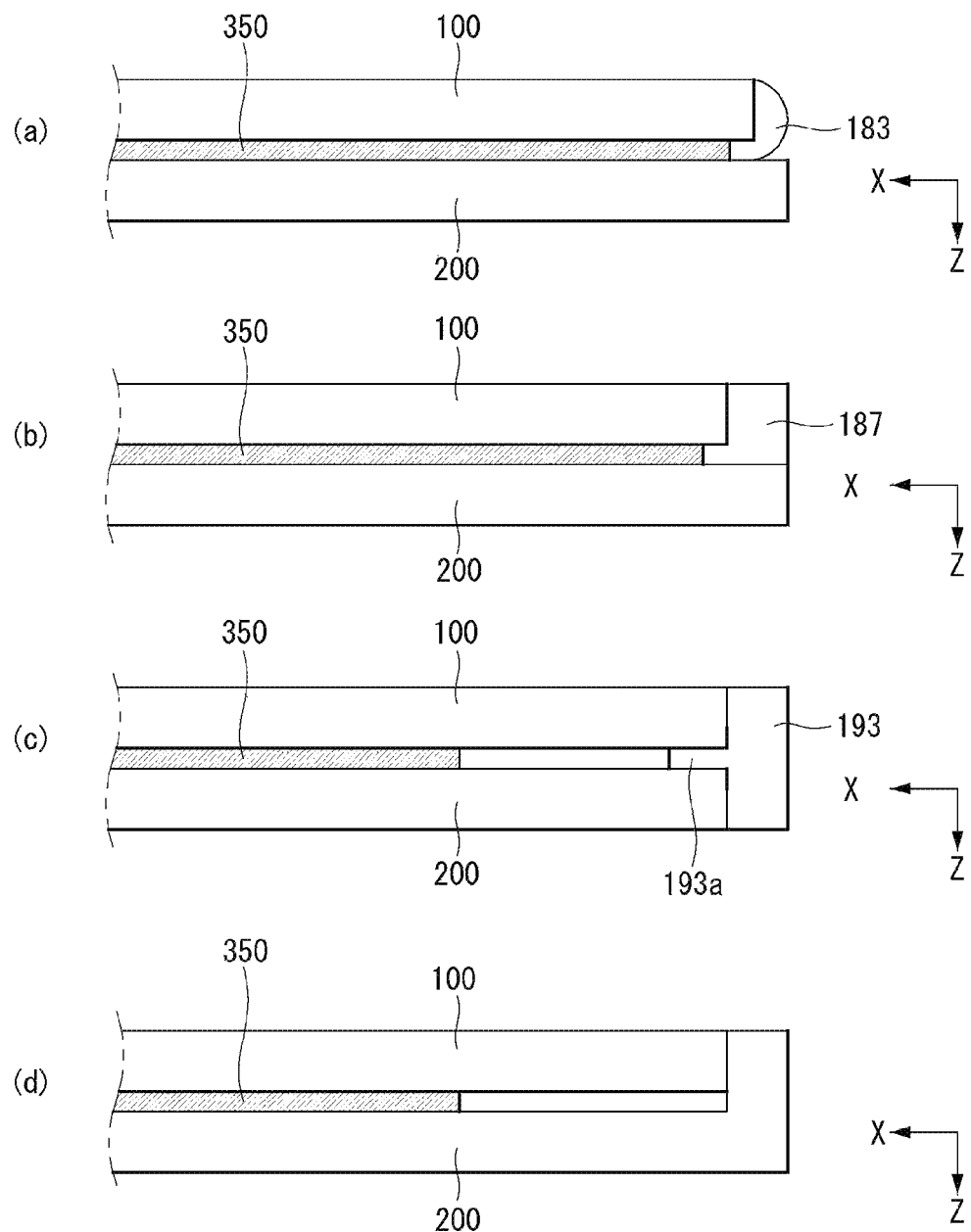

Referring to FIG. 3, the display device can include an adhesive sheet 350. The adhesive sheet 350 can attach the display panel 100 to a module cover 200. An adhesive material can be formed on one surface or both surfaces of the adhesive sheet 350. For example, the adhesive sheet 350 can include a double-sided tape.

As shown in (a) of FIG. 3, the display device can include a sealing member 183.

The sealing member 183 can be disposed between an end of the display panel 100 and the module cover 200. The end of the display panel 100 can be referred to as a side or an edge.

The sealing member 183 can seal between the display panel 100 and the module cover 200.

The adhesive sheet 350 can be disposed between the display panel 100 and the module cover 200. The sealing member 183 can seal between the side of the display panel 100 and the module cover 200 without overlapping the adhesive sheet 350.

The sealing member 183 and the adhesive sheet 350 can shield between the display panel 100 and the module cover 200. The display device can prevent foreign substances or dust from entering between the display panel 100 and the module cover 200 by shielding between the display panel 100 and the module cover 200 using the sealing member 183 and the adhesive sheet 350.

As another example, as shown in (b) of FIG. 3, the display device can include a frame 187.

The adhesive sheet 350 can be disposed between the display panel 100 and the module cover 200.

The frame 187 can be formed on the module cover 200 and can contact the side of the display panel 100. A portion of the frame 187 can extend between the display panel 100 and the module cover 200 and can be in contact with the adhesive sheet 350.

The display device can prevent foreign substances or dust from entering between the display panel 100 and the module cover 200 by forming the adhesive sheet 350 between the display panel 100 and the module cover 200 and forming the frame 187 on the side of the display panel 100.

As another example, as shown in (c) of FIG. 3, the display device can include a middle cabinet 193.

The middle cabinet 193 can be disposed between the display panel 100 and the module cover 200. The middle cabinet 193 can guide a coupling position of the display panel 100. The middle cabinet 193 can include a flange 193a. The flange 193a can be extended from one side of the middle cabinet 193. The flange 193a can be inserted between the display panel 100 and the module cover 200.

The middle cabinet 193 can prevent foreign substances or dust from entering between the display panel 100 and the module cover 200 by covering the side of the display panel 100 and the side of the module cover 200.

The flange 193a of the middle cabinet 193 can be spaced apart from the adhesive sheet 350. Thus, an amount of the adhesive sheet 350 can decrease by a separation distance between the flange 193a and the adhesive sheet 350.

As another example, as shown in (d) of FIG. 3, an edge portion of the module cover 200 can be bent to cover the display panel 100. The edge portion of the module cover 200 can be bent toward the display panel 100.

The manufacturing process of the display device can be simplified by bending the edge portion of the module cover 200.

The display device can prevent foreign substances or dust from entering between the display panel 100 and the module cover 200 by bending the edge portion of the module cover 200 and covering between the display panel 100 and the module cover 200.

The adhesive sheet 350 can be disposed between the display panel 100 and the module cover 200. The adhesive sheet 350 can be spaced apart from the bent edge of the module cover 200. Thus, an amount of the adhesive sheet 350 can decrease by a separation distance between the adhesive sheet 350 and the bent edge of the module cover 200.

In the following embodiments, a structure positioned on the side of the adhesive sheet 350 is omitted for convenience of explanation. The structure positioned on the side of the adhesive sheet 350 is applicable to other embodiments. One structure or a plurality of structures can be used.

Figure 4:
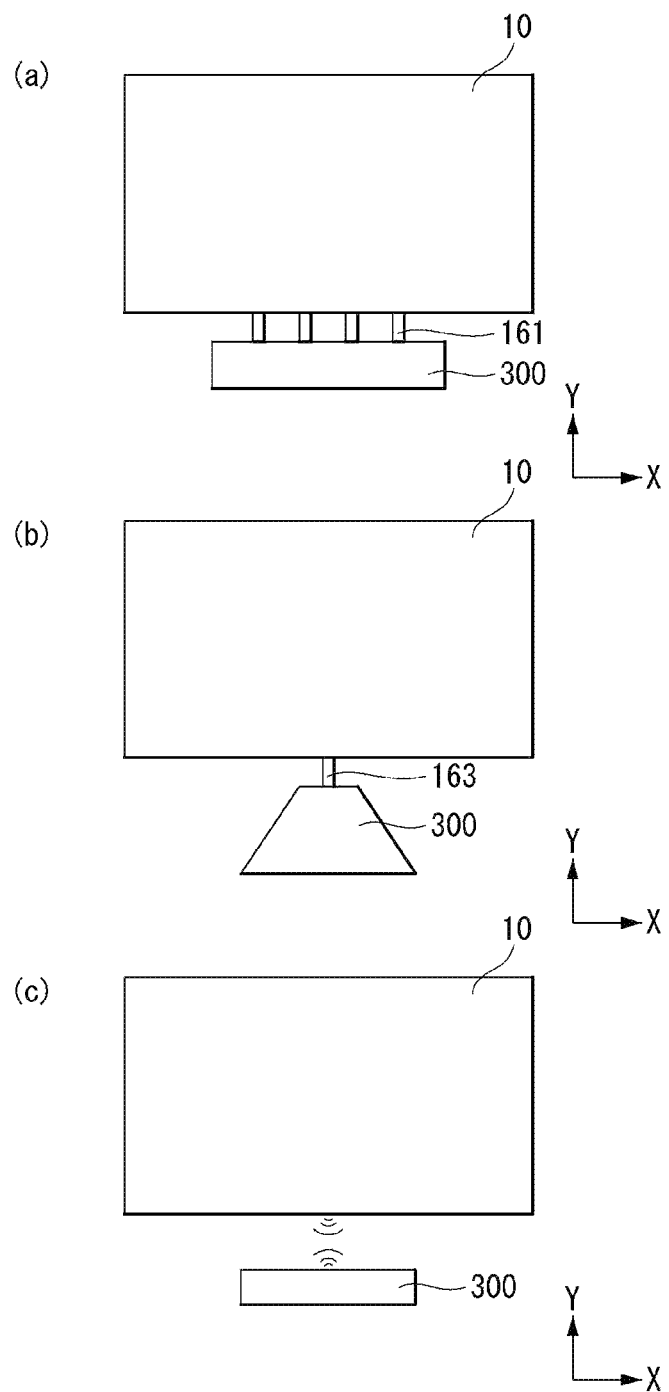

Referring to FIG. 4, the display device can include a housing 300 electrically connected to the head 10.

The housing 300 can transmit at least one driving signal to the head 10. The housing 300 can shield the components for driving the display device. For example, the housing 300 can shield at least one printed circuit board (PCB). A coupling structure and a coupling method of at least one printed circuit board will be described in detail later.

The housing 300 does not contact the head 10 and can be spaced apart from the head 10. Namely, the housing 300 may not be positioned on an image display portion of a display screen. Hence, a user can concentrate more on the display screen.

For example, as shown in (a) of FIG. 4, the housing 300 can be electrically connected to the head 10 through a plurality of flat cables 161 having a flat shape. The flat cable 161 can include a plurality of signal connection terminal pins and at least one ground terminal pin for connecting the housing 300 and the head 10. The flat cable 161 has an advantage of cheaper cost than other cables.

As another example, as shown in (b) of FIG. 4, the housing 300 can be coupled with the head 10 through one circular cable 163. Namely, unlike (a) of FIG. 4 that transmits the driving signals using the plurality of flat cables 161, the driving signals can be transmitted through one circular cable 163 in (b) of FIG. 4. Because the housing 300 and the head 10 are coupled through one circular cable 163, the user can feel that the appearance of the display device is neater.

As another example, as shown in (c) of FIG. 4, the housing 300 and the head 10 can transmit and receive the driving signals wirelessly. In this instance, the user can feel that the appearance of the display device is neater than when the housing 300 and the head 10 are coupled through the flat cables 161 shown in (a) of FIG. 4 or the circular cable 163 shown in (b) of FIG. 4. In addition, because the housing 300 and the head 10 wirelessly transmit and receive the driving signals, the structure shown in (c) of FIG. 4 can be freer with respect to constraints on a distance between the housing 300 and the head 10. Each of the housing 300 and the head 10 can be installed more freely within an allowable wireless range.

The housing 300 can include a plurality of drivers. The drivers can drive the head 10. For example, the driver can supply at least one driving signal to the head 10.

The head 10 can be provided with a minimum number of parts for driving the screen. Hence, an entire thickness of the head 10 can be further reduced.

As a result, an entire thickness of the display device can be further reduced by the thinner head 10.

Figure 5:
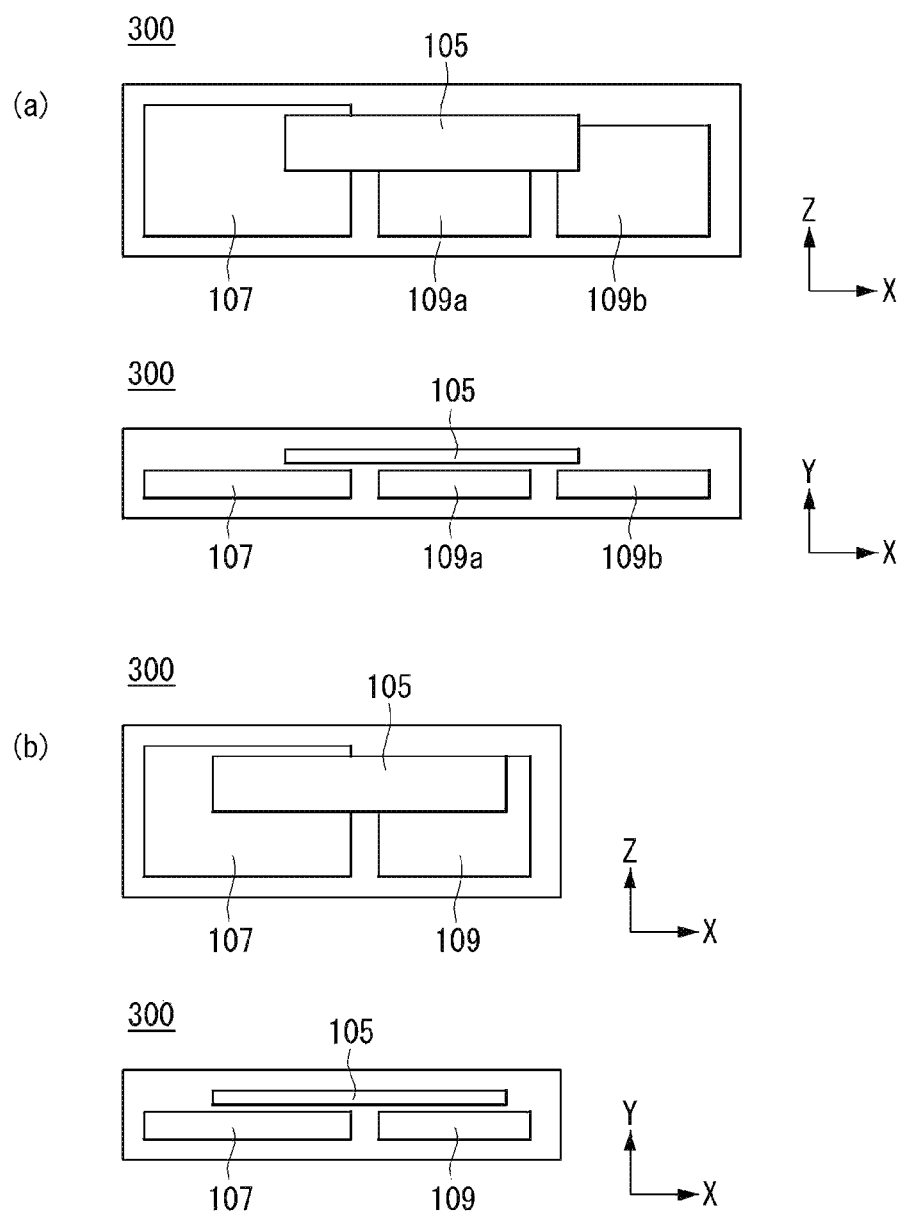

Referring to FIG. 5, the housing 300 can include at least one PCB positioned therein. The PCBs inside the housing 300 can be spaced apart from each other. The PCBs inside the housing 300 can be spaced apart from each other and electrically connected to each other.

For example, at least one PCB can be a main board 109. The main board 109 can include an interface PCB. The interface PCB can operate the display panel 100. In addition, the main board 109 can check and manage operation states of the respective components of the display device and make the components in an optimum state.

As another example, at least one PCB can include a power supply 107. The power supply 107 can supply electric power to the display device. The power supply 107 is a device supplying electric power required to drive the head 10 as well as the main board 109. The power supply 107 can be supplied with AC power from the outside, convert the AC power into DC power, and supply the DC power to the main board 109 and the head 10. Thus, the power supply 107 can stably supply the DC power to the main board 109 and the head 10. In this instance, the DC power can have a predetermined voltage or current.

As another example, at least one PCB can be a timing controller board 105. The timing controller board 105 can transmit an input driving signal to the display panel. Namely, the timing controller board 105 can transmit timing signals CLK, LOAD, and SPi and video signals R, G, and B for controlling a source PCB to the source PCB. In addition, the timing controller board 105 can control an image. The timing controller board 105 can be connected to an interface PCB via one of the flat cable 161, the circular cable 163, and the wireless transmission.

As shown in (a) of FIG. 5, at least one main board 109 can be disposed inside the housing 300. For example, the main board 109 can include a first main board 109a and a second main board 109b. The first main board 109a can be positioned in the center of the housing 300. The second main board 109b can be spaced apart from the first main board 109a and can be positioned on the right side of the housing 300. The power supply 107 can be spaced apart from the first main board 109a and can be positioned on the left side of the housing 300.

The timing controller board 105 can be positioned on the upper surfaces of the main board 109 and the power supply 107. Thus, an internal space of the housing 300 can be saved.

In addition, the housing 300 can include a timing controller shield. The timing controller shield can be attached at a position to mount the timing controller board 105 inside the housing 300. Namely, the timing controller board 105 can be coupled with not the power supply 107 and the main board 109 but the timing controller shield. The timing controller shield can prevent signal interference and a noise. Further, the timing controller shield can prevent a malfunction of the timing controller board 105, the power supply 107, or the main board 109. The timing controller shield can prevent electromagnetic waves from occurring in the power supply 107 and the main board 109.

The timing controller shield can serve as a buffer for buffering an impact generated from the outside, thereby protecting the timing controller board 105 from impact.

The timing controller board 105 can overlap the power supply 107 and the main board 109 in a height direction of the housing 300 or an up-down direction Y. Hence, the timing controller board 105 can be more easily coupled with the power supply 107 and the main board 109.

As shown in (b) of FIG. 5, one main board 109 can be mounted inside the housing 300 unlike (a) of FIG. 5. The main board 109 can be positioned on one side of the housing 300, and the power supply 107 can be positioned on the other side of the housing 300. The main board 109 and the power supply 107 can be positioned to face each other in a long axis direction of the housing 300 or a left-right direction X.

Because the timing controller board 105 is positioned on the power supply 107 and the main board 109, the internal space of the housing 300 can be saved. Hence, the entire size of the housing 300 can decrease, and the freedom of the design of the internal space of the housing 300 can be improved.

Figure 6:
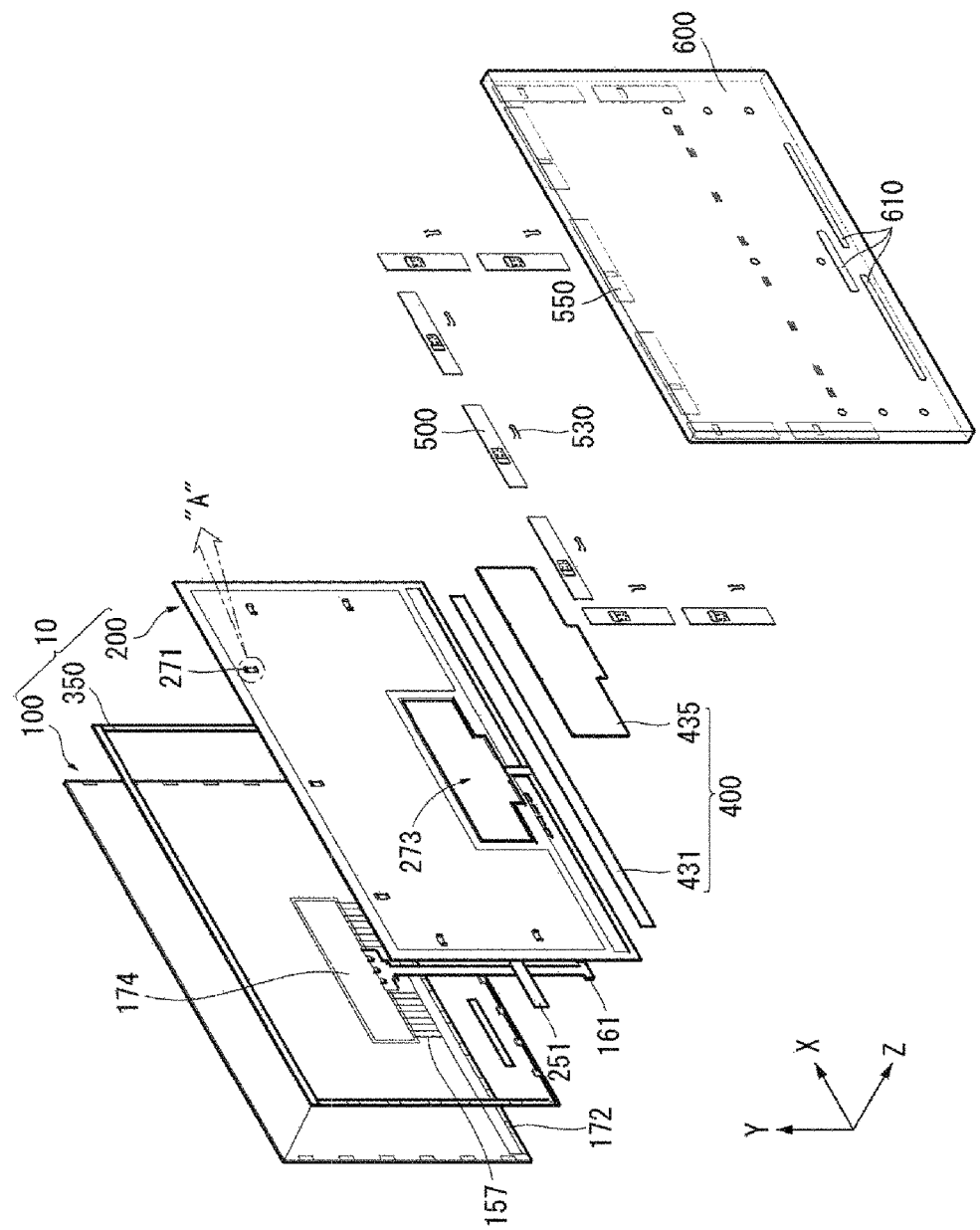
FIGS. 6 to 18 illustrate examples of a display device according to an embodiment of the disclosure.

Referring to FIG. 6, the head 10 can include the display panel 100, the module cover 200, and a PCB cover 400. The module cover 200 may be referred to as a frame.

The display panel 100 can be provided in front or at the front surface of the head 10 and can display an image. The display panel 100 can divide the image into a plurality of pixels and cause each pixel to emit light while adjusting color, brightness, and chroma of each pixel, thereby outputting an image.

The display panel 100 can include an interface PCB 174 and a source PCB 172 on a rear surface of the display panel 100. A plurality of interface PCBs 174 can be disposed on the rear surface of the display panel 100, and a plurality of source PCBs 172 can be disposed on the rear surface of the display panel 100. The plurality of source PCBs 172 can be spaced apart from one another.

The interface PCB 174 can be positioned on the source PCB 172. The source PCB 172 can be connected to the interface PCB 174.

The interface PCB 174 can be connected to signal lines 157. For example, the signal lines can include the flat cable 161 and the circular cable 163. The signal lines can transmit driving signals, such as timing control signals and digital video data received from the timing controller board 105 (see FIG. 5) of the housing 300, to the interface PCB 174.

The source PCB 172 can apply a data voltage to the display panel 100 in response to a signal received from the interface PCB 174. For example, the source PCB 172 can include a source chip-on film (COF) or a data integrated circuit (IC).

The adhesive sheet 350 and an insulating sheet 251 can be disposed between the display panel 100 and the module cover 200.

The adhesive sheet 350 can attach the display panel 100 to the module cover 200. The adhesive sheet 350 can have a rectangular frame shape with an empty center.

The insulating sheet 251 can be attached to the front surface of the module cover 200 and can be positioned at a portion corresponding to the source PCB 172. The insulating sheet 251 can include an insulating material. Hence, the insulating sheet 251 can block signal interference generated in another electronic device and prevent an erroneous operation of the source PCB 172 resulting from the signal interference.

The module cover 200 can be disposed on the rear surface of the display panel 100. The module cover 200 can support the display panel 100. Namely, the module cover 200 can reinforce the rigidity of the display panel 100. Thus, the module cover 200 can include a lightweight and high-strength material. For example, the module cover 200 can include aluminum.

A thickness of a portion of the module cover 200 can be different from a thickness of another portion of the module cover 200. Namely, the module cover 200 can be formed. For example, a thickness of an edge portion of the module cover 200 can be different from a thickness of a center portion of the module cover 200. The edge portion of the module cover 200 can be an edge or a border of the module cover 200. The center portion of the module cover 200 can be a remaining portion excluding the edge portion from the module cover 200. The thickness of the edge portion of the module cover 200 can be greater than the thickness of the center portion of the module cover 200. Hence, the rigidity of the module cover 200 can be further improved.

Further, when the module cover 200 is coupled with a bracket 500, a portion of the bracket 500 can be covered due to the thickness of the edge portion of the module cover 200.

The module cover 200 can include one or more latches 271. The latch 271 can be disposed on the rear surface of the module cover 200.

The latch 271 can be disposed along the edge of the module cover 200. One or more latches 271 can be spaced apart from each other at a predetermined distance.

The latch 271 can be disposed on the first long side LS1 (see FIG. 1), the first short side SS1 (see FIG. 1), and the second short side SS2 (see FIG. 1) of the module cover 200.

The module cover 200 can include a cover opening 273. The cover opening 273 can be positioned in the center of the module cover 200. The cover opening 273 can penetrate the module cover 200. The cover opening 273 can be disposed at a location corresponding to the interface PCB 174.

Because the module cover 200 passes through the cover opening 273 and is opened, cracks that can be generated in the module cover 200 or the rigidity of the module cover 200 need to be considered. Thus, the cover opening 273 can be formed to have substantially the same size as the entire size of the interface PCB 174.

The module cover 200 can include a PCB cover 400. The PCB cover 400 can include a first PCB cover 431 and a second PCB cover 435.

The first PCB cover 431 can be fastened to the rear surface of the module cover 200 and cover the cover opening 273. The second PCB cover 435 can be fastened to the rear surface of the module cover 200 and cover the source PCB 172.

The PCB cover 400 can prevent foreign substances from penetrating into the source PCB 172 or the interface PCB 174.

The PCB cover 400 can include an insulating material. For example, the PCB cover 400 can include a plastic material. The PCB cover 400 can block signal interference resulting from a driving signal or a control signal generated in another electronic device. In addition, the PCB cover 400 can protect the source PCB 172 and the interface PCB 174 from a leakage current flowing in the outside or another electronic device.

In addition, in the head 10 of the display device, the display panel 100 can be supported only by the module cover 200. Namely, the head 10 may not have any cover other than the module cover 200. Hence, the entire thickness of the display device can be further reduced by the head 10.

The bracket 500 can be disposed in the rear of the display panel 100 or in the rear of the head 10. The bracket 500 can be fixed or fastened to a plate 600.

One or more brackets 500 can be spaced apart from each other.

Some of the plurality of brackets 500 can be extended along an upper side of the plate 600 or the first long side LS1 (see FIG. 1) in the left-right direction X. Further, the remaining brackets 500 can be extended along the side of the plate 600 or the first and second short sides SS1 and SS2 (see FIG. 1) in the up-down direction Y.

A fixing pin 530 can be disposed between the bracket 500 and the plate 600 or between the bracket 500 and an adhesive member 550.

A coupling unit can include a part or a unit capable of coupling or fastening the module cover 200 to the bracket 500. For example, the coupling unit can include the fixing pin 530 on the bracket 500 and the latch 271 on the module cover 200.

The adhesive member 550 can be disposed in the rear or the rear surface of the bracket 500. The adhesive member 550 can be disposed between the bracket 500 and the plate 600.

The adhesive member 550 can firmly attach and fix the bracket 500 to the plate 600. For example, the adhesive member 550 can be an adhesive material, an adhesive sheet, and a double-sided tape, of which both surfaces can be used for the adhesion. As another example, the adhesive member 550 can be a strong glue, and the like.

The adhesive member 550 can have substantially the same shape as a shape of a contact portion between the bracket 500 and the plate 600. For example, the adhesive member 550 can have substantially the same shape as a lower surface of the bracket 500.

The plate 600 can be disposed in the rear of the head 10 or in the rear of the display panel 100. For example, the plate 600 can be a glass using silicon dioxide (SiO$_2$), which constitutes a sand or a crystal, as a main component. The plate 600 can include soda, lime glass, borosilicate glass, acrylic resin, sugar glass, mica or aluminum oxynitride, and the like. Namely, the plate 600 can be fixed to glass, tempered glass, transparent plastic, and the like.

The plate 600 can fix the bracket 500 and restrict a movement of the head 10.

The plate 600 can have a line hole 610 near the bottom of a central area. The line hole 610 can be formed to penetrate the plate 600 in a front-rear direction. The line hole 610 can penetrate the flat cable 161 (see (a) of FIG. 4) or the circular cable 163 (see (b) of FIG. 4). The flat cable 161 (see (a) of FIG. 4) or the circular cable 163 (see (b) of FIG. 4) can be disposed on a rear surface of the plate 600 and thus can be rapidly and simply arranged.

Figure 7:
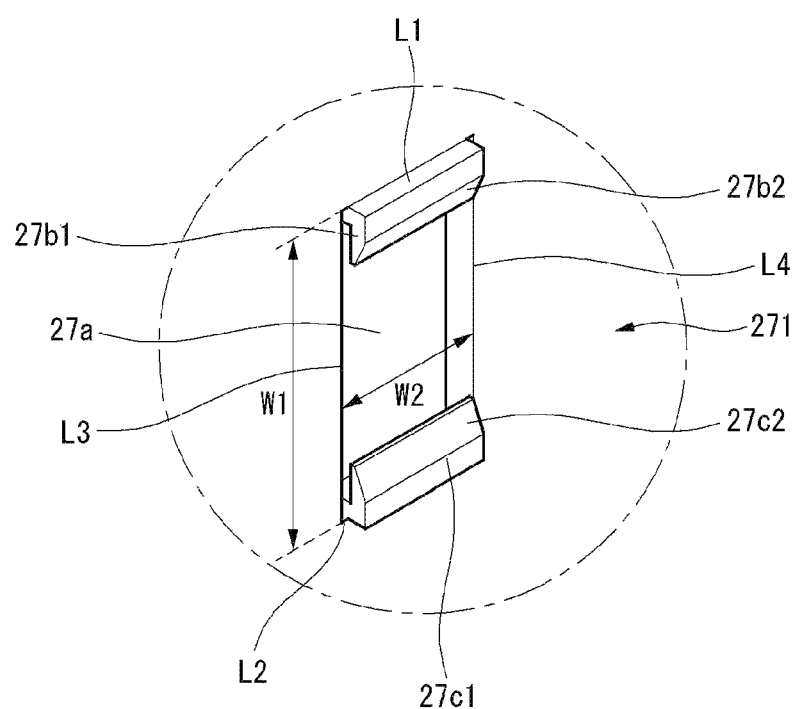
Figure 8:
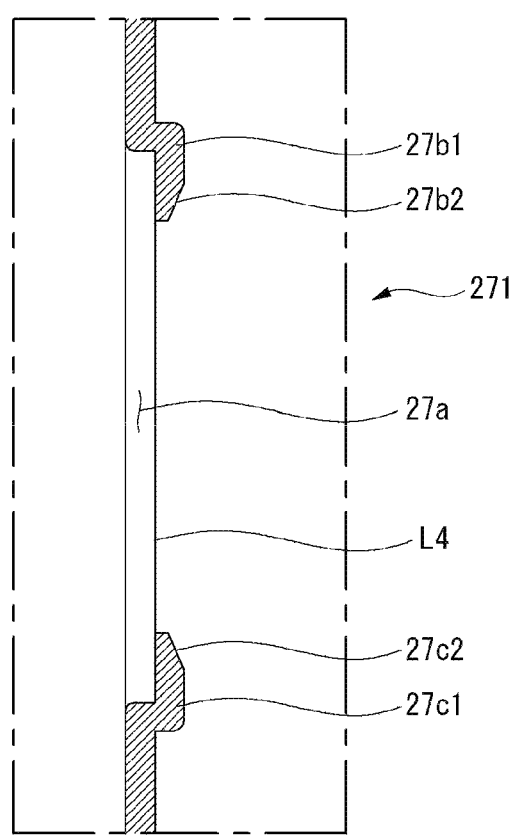

FIG. 7 is an enlarged view of a portion "A" of FIG. 6. Referring to FIGS. 7 and 8, the module cover 200 can include at least one latch 271 and an accommodating hole 27*a*.

The latch 271 can include a first latch 27*b*1 and a second latch 27*c*1 that face each other.

The accommodating hole 27*a* can be recessed in a direction from the rear surface to the front surface of the module cover 200 or can penetrate the module cover 200. The accommodating hole 27*a* can include a first receiving side L1 and a fourth receiving side L4 (e.g., the accommodating hole can be a recess, such a depression into a surface of the latch or a surface of the module cover).

The first receiving side L1 can have a predetermined length.

A second receiving side L2 can be spaced apart from the first receiving side L1 and can be positioned opposite the first receiving side L1.

A third receiving side L3 can be disposed between the first receiving side L1 and the second receiving side L2.

The fourth receiving side L4 can be disposed between the first receiving side L1 and the second receiving side L2 and can be spaced apart from the third receiving side L3.

A first width W1 between the first receiving side L1 and the second receiving side L2 can be greater than a second width W2 between the third receiving side L3 and the fourth receiving side L4. The first width W1 may be referred to as a first distance, and the second width W2 may be referred to as a second distance.

The accommodating hole 27*a* can be disposed between the first latch 27*b*1 and the second latch 27*c*1.

The first latch 27*b*1 can protrude from one side of the accommodating hole 27*a*. The one side of the accommodating hole 27*a* can be the first receiving side L1. The first latch 27*b*1 can protrude in a direction from the front surface to the rear surface of the module cover 200 or in a direction toward the plate 600 (see FIG. 6) and can be bent toward the second latch 27*c*1. A thickness of the bent first latch 27*b*1 can gradually decrease. The first latch 27*b*1 can have an inclined surface 27*b*2 inclined in an oblique direction. The oblique direction can be a direction converging toward the accommodating hole 27*a*.

The second latch 27*c*1 can protrude from the other side of the accommodating hole 27*a*. The other side of the accommodating hole 27*a* can be the second receiving side L2. The second latch 27*c*1 can protrude in the same direction as the first latch 27*b*1 and can be bent toward the first latch 27*b*1. A thickness of the bent second latch 27*c*1 can gradually decrease. The second latch 27*c*1 can have an inclined surface 27*c*2 inclined in an oblique direction intersecting the oblique direction of the first latch 27*b*1.

Figure 9:
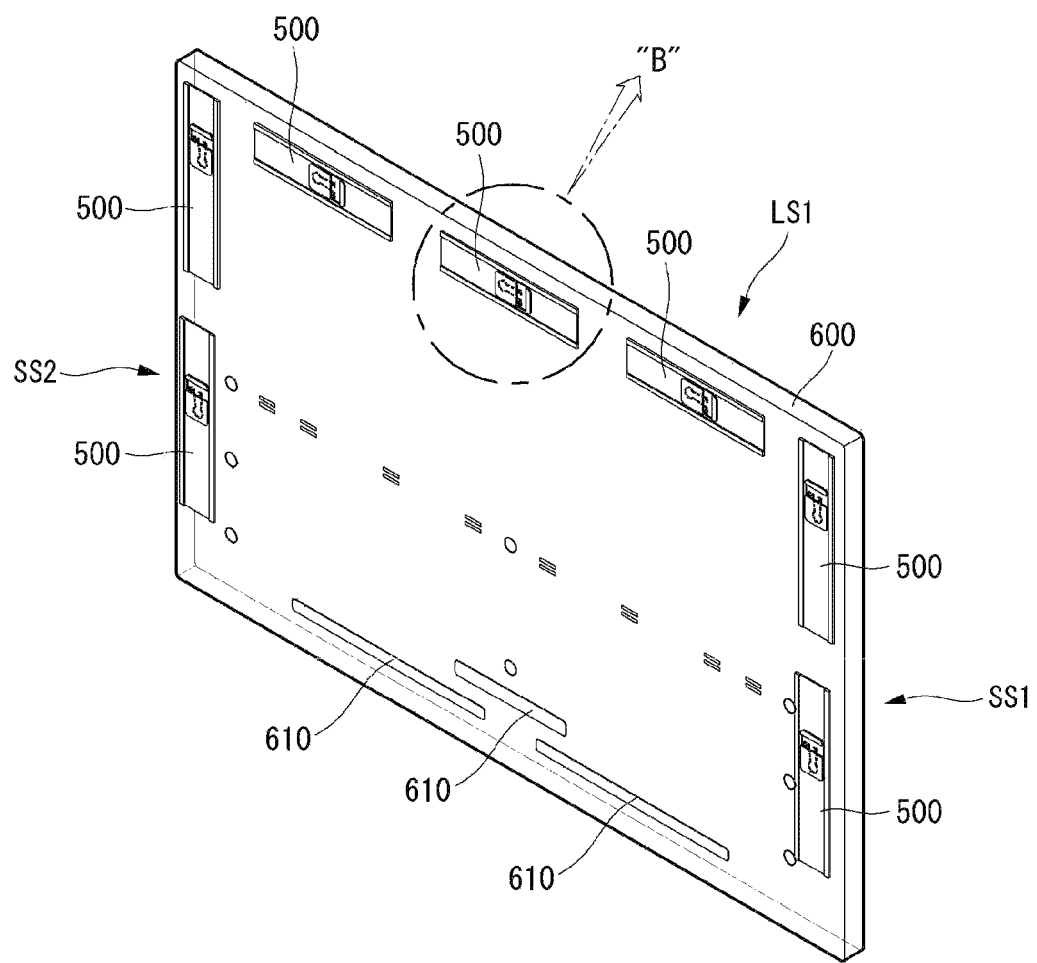
Figure 10:
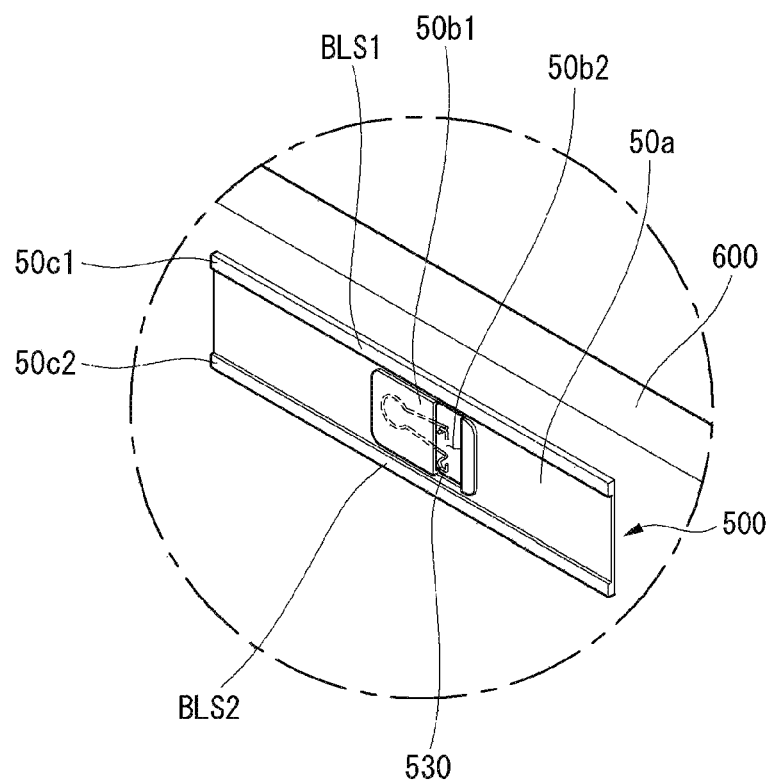

Referring to FIGS. 9 and 10, the plurality of brackets 500 can be spaced apart from one another on the plate 600. FIG. 10 is an enlarged view of a portion "B" of FIG. 9.

Some of the plurality of brackets 500 can be extended along the upper side of the plate 600 or the first long side LS1 in the left-right direction X. Further, the remaining brackets 500 can be extended along the side of the plate 600 or the first and second short sides SS1 and SS2 in the up-down direction Y.

Each bracket 500 can include a bracket body 50*a*, first and second bracket supporters 50*c*1 and 50*c*2, a pin housing 50*b*1, and a pin hole 50*b*2.

The bracket body 50*a* can be formed in a predetermined flat plate shape. For example, the bracket body 50*a* can have a rectangular shape. The bracket body 50*a* may be referred to as a body.

The bracket supporters 50*c*1 and 50*c*2 can be disposed on an upper surface of the bracket body 50*a*. The bracket supporters 50*c*1 and 50*c*2 may be referred to as a supporter. The bracket supporters 50*c*1 and 50*c*2 can include a first bracket supporter 50*c*1 and a second bracket supporter 50*c*2.

The first bracket supporter 50*c*1 can be extended along an upper side BLS1 of the upper surface of the bracket body 50*a*. The upper side BLS1 may be referred to as a first bracket long side BLS1. The first bracket supporter 50*c*1 can be extended from the upper side BLS1 of the bracket body 50*a* by a predetermined height.

The second bracket supporter 50*c*2 can be spaced apart from the first bracket supporter 50*c*1 and extended along a lower side BLS2 of the upper surface of the bracket body 50*a*. The lower side BLS2 may be referred to as a second bracket long side BLS2. The second bracket supporter 50*c*2 can be extended from the lower side BLS2 of the bracket body 50*a* by a predetermined height.

The pin housing 50*b*1 can be disposed on the upper surface of the bracket body 50*a*. The pin housing 50*b*1 can be disposed between the first bracket supporter 50*c*1 and the second bracket supporter 50*c*2. The pin housing 50*b*1 can protrude from the upper surface of the bracket body 50*a*. The pin housing 50*b*1 can be recessed in a direction from a lower surface to the upper surface of the bracket body 50*a*. The pin housing 50*b*1 can provide an internal space.

The pin hole 50*b*2 can be disposed on an upper surface of the pin housing 50*b*1. The pin hole 50*b*2 can be disposed between the first bracket supporter 50*c*1 and the second bracket supporter 50*c*2. The pin hole 50*b*2 can be formed to penetrate the pin housing 50*b*1.

The fixing pin 530 can be disposed in the internal space of the pin housing 50*b*1. A portion of the fixing pin 530 can be exposed through the pin hole 50*b*2.

Figure 11:
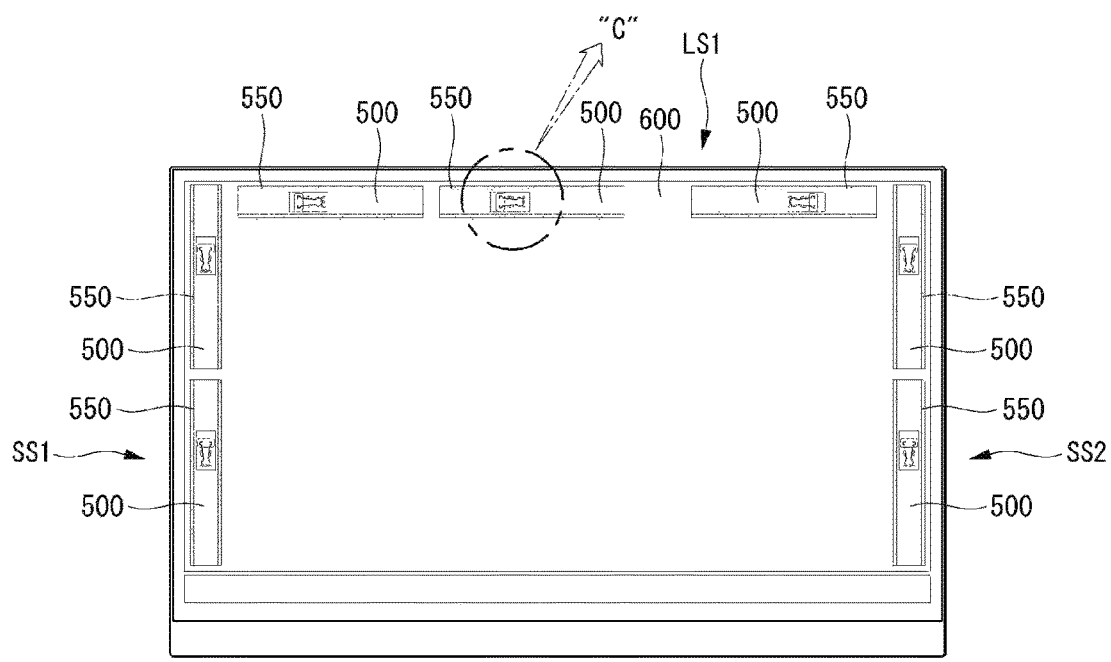

Referring to FIG. 11, the adhesive member 550 can be disposed in the rear or the rear surface of the bracket 500. The adhesive member 550 can be disposed in front or the front surface of the plate 600. The adhesive member 550 can be disposed between the bracket 500 and the plate 600. The adhesive member 550 can include a first adhesive member 550a and a second adhesive member 550b.

The first adhesive member 550a can be extended along an upper side BLS1 of the lower surface of the bracket 500. The upper side BLS1 may be referred to as a first bracket long side BLS1.

The second adhesive member 550b can be spaced apart from the first adhesive member 550a and extended along a lower side BLS2 of the lower surface of the bracket 500. The lower side BLS2 may be referred to as a second bracket long side BLS2.

Figure 12:
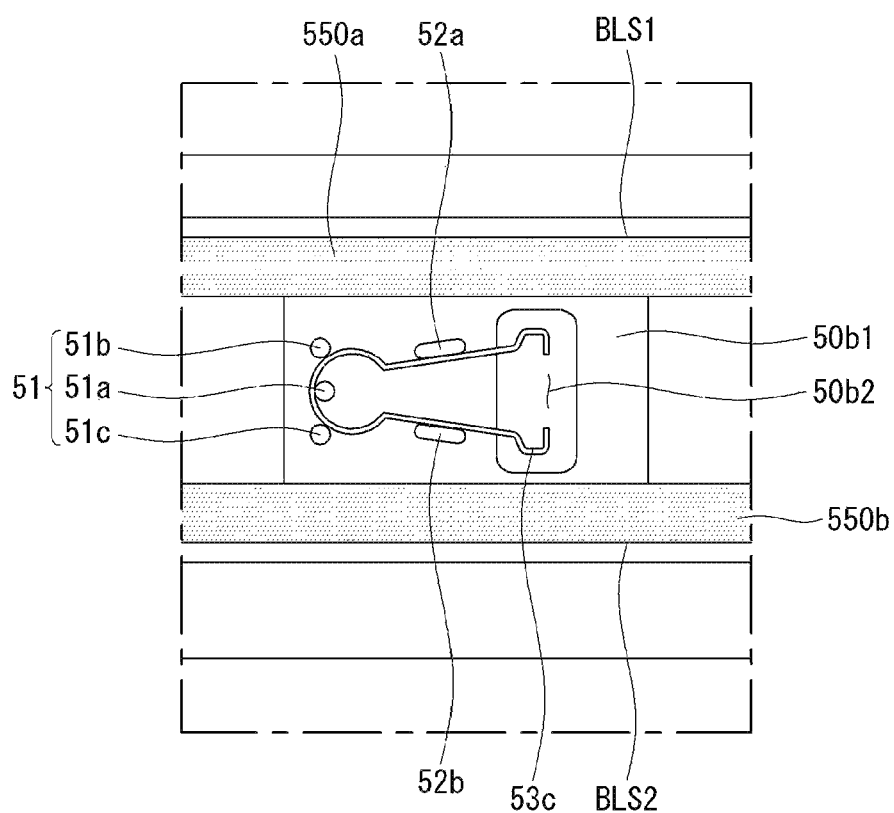

FIG. 12 is an enlarged view of a portion "C" of FIG. 11. Referring to FIG. 12, an internal space of the bracket 500 can be disposed between the first adhesive member 550a and the second adhesive member 550b. The internal space of the bracket 500 may be referred to as the internal space of the pin housing 50b1.

One or more pin fixing protrusions 51, 52a, and 52b can be formed in the internal space of the bracket 500. The pin fixing protrusions 51, 52a, and 52b can be disposed in the internal space of the bracket 500 and protrude toward the plate 600.

The pin fixing protrusions 51, 52a, and 52b can include first to fifth pin fixing protrusions 51a, 51b, 51c, 52a, and 52b.

The first pin fixing protrusion 51a can be formed in a cylindrical shape.

The second pin fixing protrusion 51b can be spaced apart from the first pin fixing protrusion 51a. The second pin fixing protrusion 51b can be disposed between the first adhesive member 550a and the first pin fixing protrusion 51a. The second pin fixing protrusion 51b can be formed in a cylindrical shape.

The third pin fixing protrusion 51c can be spaced apart from the first pin fixing protrusion 51a and the second pin fixing protrusion 51b. The third pin fixing protrusion 51c can be disposed between the second adhesive member 550b and the first pin fixing protrusion 51a.

The first pin fixing protrusion 51a can be disposed between the second pin fixing protrusion 51b and the third pin fixing protrusion 51c.

The fourth pin fixing protrusion 52a can be spaced apart from the second pin fixing protrusion 51b. The fourth pin fixing protrusion 52a can be formed in a cylindroid shape. The fourth pin fixing protrusion 52a can be disposed between the second pin fixing protrusion 51b and the pin hole 50b2.

The fifth pin fixing protrusion 52b can be spaced apart from the third pin fixing protrusion 51c and the fourth pin fixing protrusion 52a. For example, the fifth pin fixing protrusion 52b can be spaced apart from the third pin fixing protrusion 51c in a horizontal direction and spaced apart from the fourth pin fixing protrusion 52a in a vertical direction. The fifth pin fixing protrusion 52b can be formed in a cylindroid shape. The fifth pin fixing protrusion 52b can be disposed between the third pin fixing protrusion 51c and the pin hole 50b2.

The fixing pin 530 can be disposed between the first to fifth pin fixing protrusions 51a, 51b, 51c, 52a, and 52b. The fixing pin 530 can be mounted in the internal space of the bracket 500 by the first to fifth pin fixing protrusions 51a, 51b, 51c, 52a, and 52b.

Figure 13:
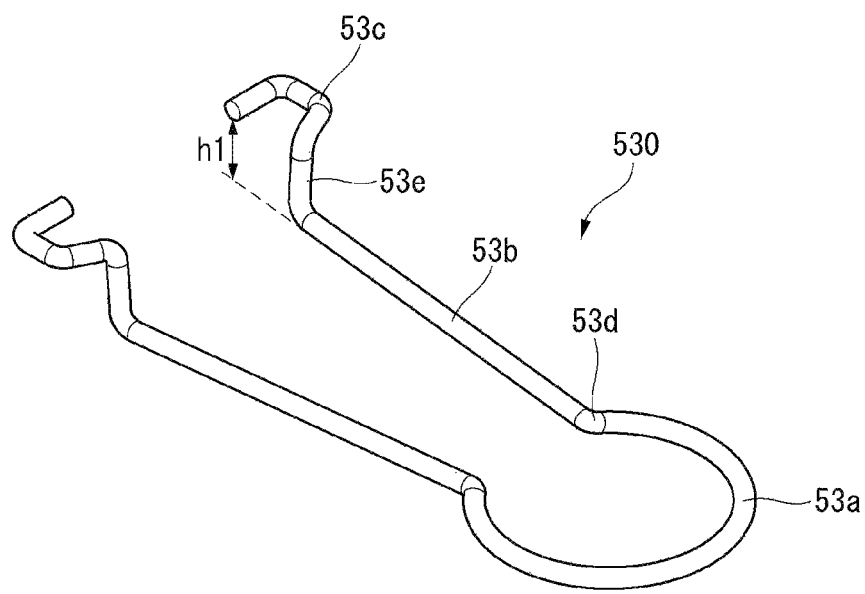
Figure 14:
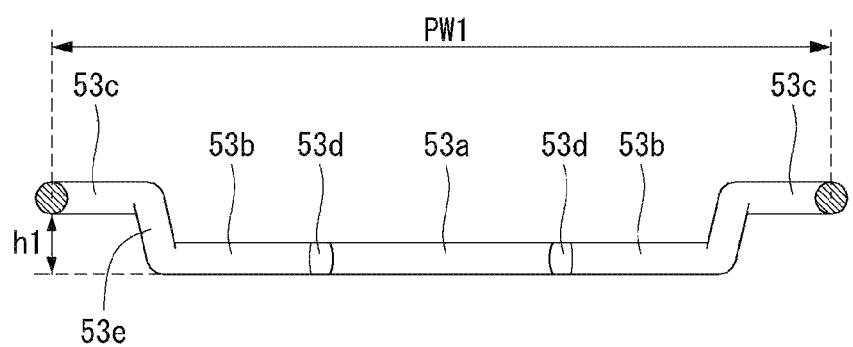

Referring to FIGS. 13 and 14, the fixing pin 530 can include a pin elastic portion 53a, a pin transfer portion 53b, a pin fastening portion 53c, a first pin connecting portion 53d, and a second pin connecting portion 53e.

The pin elastic portion 53a can be accommodated in the internal space of the pin housing 50b1 and formed in a circular shape in which a portion is opened. The pin elastic portion 53a may be referred to as an elastic portion. The pin elastic portion 53a can have an elastic force that causes a modified shape to return to an original shape within an elastic range.

The pin transfer portions 53b can be accommodated in the internal space of the pin housing 50b1 and respectively extended from both ends of the opened portion of the pin elastic portion 53a. The pin transfer portion 53b may be referred to as a transfer portion. The pin transfer portions 53b can transfer the elastic force generated by the pin elastic portion 53a.

The first pin connecting portion 53d can be disposed between the pin elastic portion 53a and the pin transfer portion 53b. The first pin connecting portion 53d can connect the pin elastic portion 53a to the pin transfer portion 53b.

The pin fastening portion 53c can be extended from the pin transfer portion 53b. The pin fastening portion 53c may be referred to as a fastening portion. The pin fastening portion 53c is not accommodated in the internal space of the pin housing 50b1. The pin fastening portion 53c can be extended from the pin transfer portion 53b in a direction toward the plate 600 (see FIG. 6) and can be bent one or more times. For example, the pin fastening portion 53c can have a "⊏"-shape.

The second pin connecting portion 53e can be disposed between the pin transfer portion 53b and the pin fastening portion 53c. The second pin connecting portion 53e can protrude from the pin transfer portion 53b in the vertical direction and can be connected to the pin fastening portion 53c.

The pin fastening portion 53c can be formed higher than the pin elastic portion 53a and the pin transfer portion 53b by a length h1 of the second pin connecting portion 53e.

Figure 15:
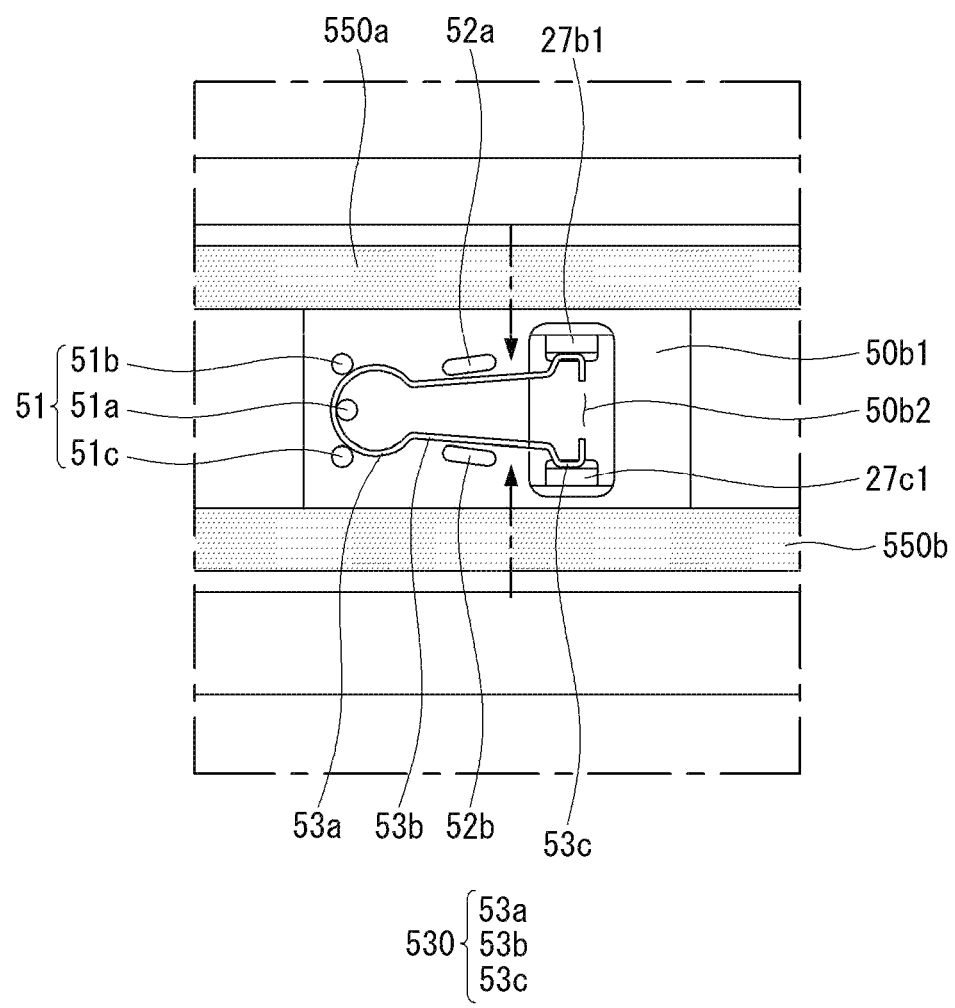
Figure 16:
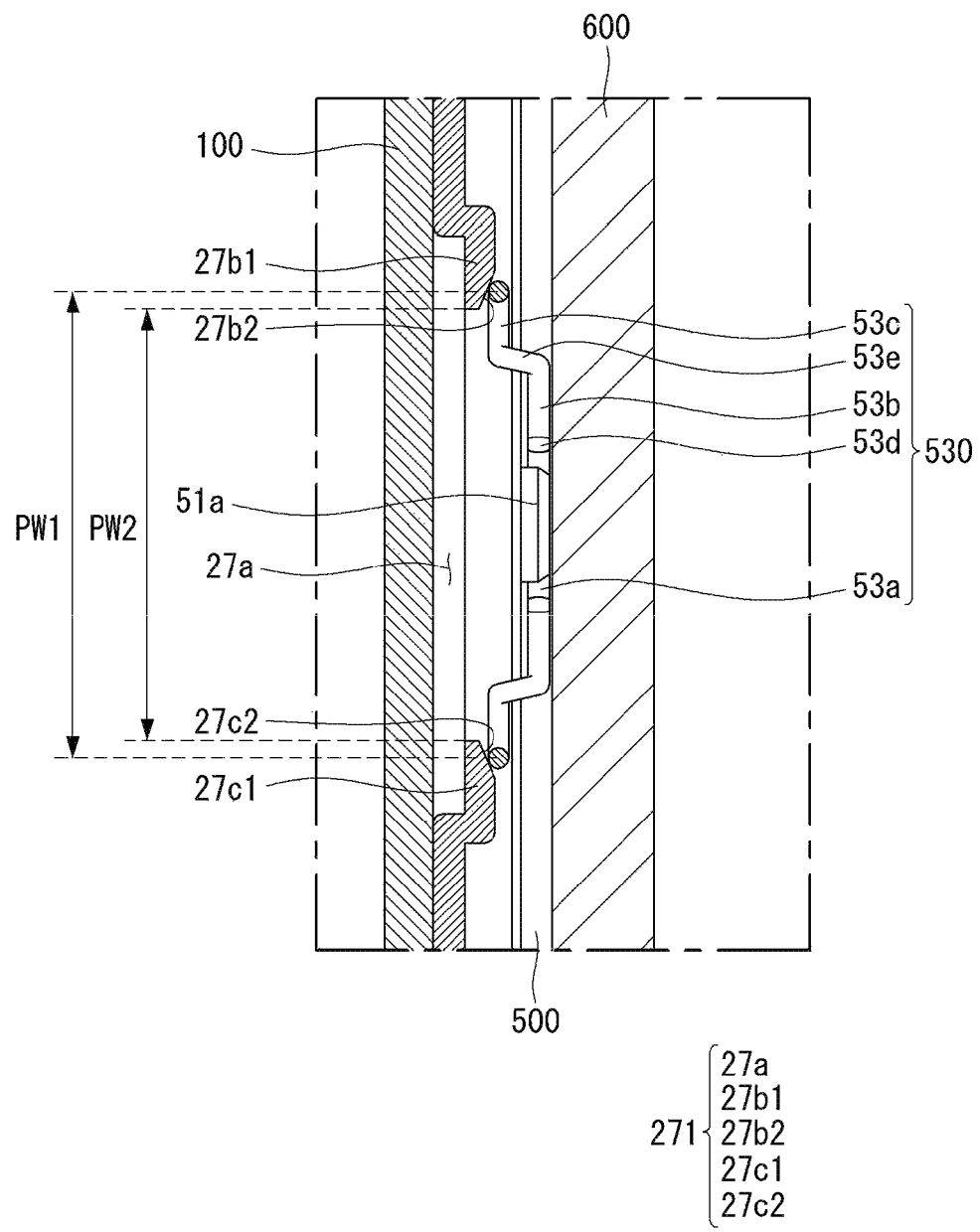

Referring to FIGS. 15 and 16, the fixing pin 530 can be disposed between the first to fifth pin fixing protrusions 51a, 51b, 51c, 52a, and 52b. The first pin fixing protrusion 51a can be disposed inside the pin elastic portion 53a of the fixing pin 530. The second pin fixing protrusion 51b and the third pin fixing protrusion 51c can be disposed outside the pin elastic portion 53a of the fixing pin 530.

The pin elastic portion 53a of the fixing pin 530 can be disposed between the first pin fixing protrusion 51a and the second pin fixing protrusion 51b and between the first pin fixing protrusion 51a and the third pin fixing protrusion 51c.

The outside of the pin elastic portion 53a of the fixing pin 530 can be adjacent to the second pin fixing protrusion 51b and the third pin fixing protrusion 51c. The inside of the pin elastic portion 53a of the fixing pin 530 can be adjacent to the first pin fixing protrusion 51a.

The pin transfer portion 53b of the fixing pin 530 can be disposed between the fourth pin fixing protrusion 52a and the fifth pin fixing protrusion 52b. The outside of the pin transfer portion 53b of the fixing pin 530 can be adjacent to the fourth pin fixing protrusion 52a and the fifth pin fixing protrusion 52b.

The pin fastening portion 53c of the fixing pin 530 can be disposed higher than the opened pin hole 50b2. The pin fastening portion 53c of the fixing pin 530 can protrude from the pin hole 50b2 and can be exposed to the outside.

The latch 271 on the module cover 200 can be positioned opposite the fixing pin 530 on the bracket 500. The latch 271 can approach the fixing pin 530. Alternatively, the fixing pin 530 can approach the latch 271. Namely, the module cover 200 can approach the bracket 500.

The pin fastening portions 53c of the fixing pin 530 can face the inclined surfaces 27b2 and 27c2 of the first and second latches 27b1 and 27c1. The pin fastening portions 53c of the fixing pin 530 can continue to approach the accommodating hole 27a along the inclined surfaces 27b2 and 27c2 of the first and second latches 27b1 and 27c1. Hence, the bracket 500 can be fastened to the module cover 200. A width PW1 between the pin fastening portions 53c of the fixing pin 530 can decrease as the pin fastening portions 53c approach the accommodating hole 27a along the inclined surfaces 27b2 and 27c2 of the first and second latches 27b1 and 27c1. The width PW1 between the pin fastening portions 53c of the fixing pin 530 may be referred to as a first fastening width. The first fastening width PW1 can be less than a width PW2 between the first and second latches 27b1 and 27c1. The width PW2 between the first and second latches 27b1 and 27c1 can be expressed as a length measured from the end of the first latch 27b1 to the end of the second latch 27c1. The width PW2 between the first and second latches 27b1 and 27c1 may be referred to as a second fastening width.

The first fastening width PW1 can decrease due to the elasticity of the pin elastic portion 53a of the fixing pin 530. In this instance, the pin transfer portion 53b of the fixing pin 530 can be spaced apart from the fourth and fifth pin fixing protrusions 52a and 52b.

Figure 17:
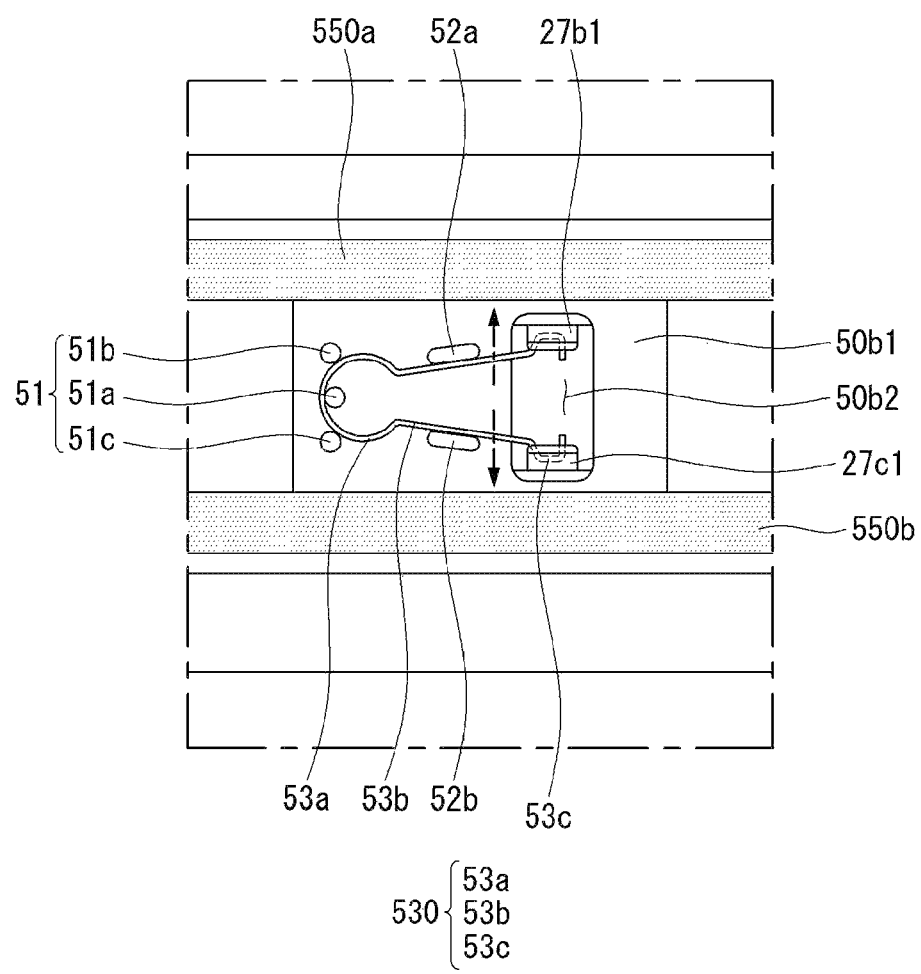
Figure 18:
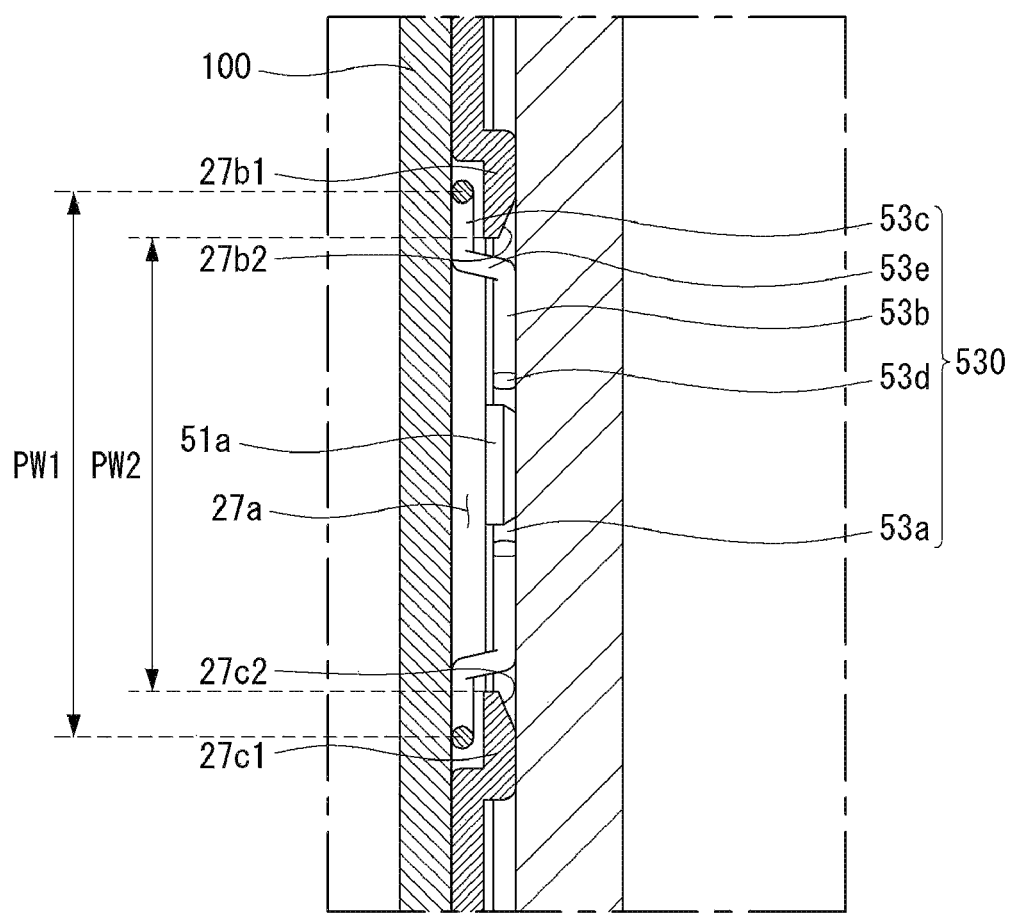

Referring to FIGS. 17 and 18, the pin fastening portions 53c of the fixing pin 530 can pass the inclined surfaces 27b2 and 27c2 of the first and second latches 27b1 and 27c1 and can be inserted or positioned in the accommodating hole 27a. At the same time, the first and second latches 27b1 and 27c1 can be inserted or positioned in the pin hole 50b2. The bracket 500 can be mounted on the module cover 200.

The pin fastening portions 53c of the fixing pin 530 can overlap the first and second latches 27b1 and 27c1. The pin fastening portions 53c of the fixing pin 530 can be inserted or positioned in the accommodating hole 27a and can face the module cover 200. The first and second latches 27b1 and 27c1 can be inserted or positioned in the pin hole 50b2 and can face the plate 600.

When the pin fastening portions 53c of the fixing pin 530 are inserted or positioned in the accommodating hole 27a, the first fastening width PW1 can be again maintained at an original width or an original distance. In this instance, the first fastening width PW1 can be greater than the second fastening width PW2. The first fastening width PW1 can be restored to the original width or the original distance by the elasticity of the pin elastic portion 53a of the fixing pin 530. In this instance, the pin transfer portion 53b of the fixing pin 530 can be adjacent to the fourth and fifth pin fixing protrusions 52a and 52b.

The first fastening width PW1 can be maintained to be greater than the second fastening width PW2 using the elasticity of the pin elastic portion 53a of the fixing pin 530. The module cover 200 can be firmly mounted on the plate 600.

When the fixing pin 530 on the bracket 500 is coupled with the latch 271 on the module cover 200, the width of the pin fastening portion 53c can decrease and can be again restored to the original width using the elasticity of the pin elastic portion 53a.

Figure 19:
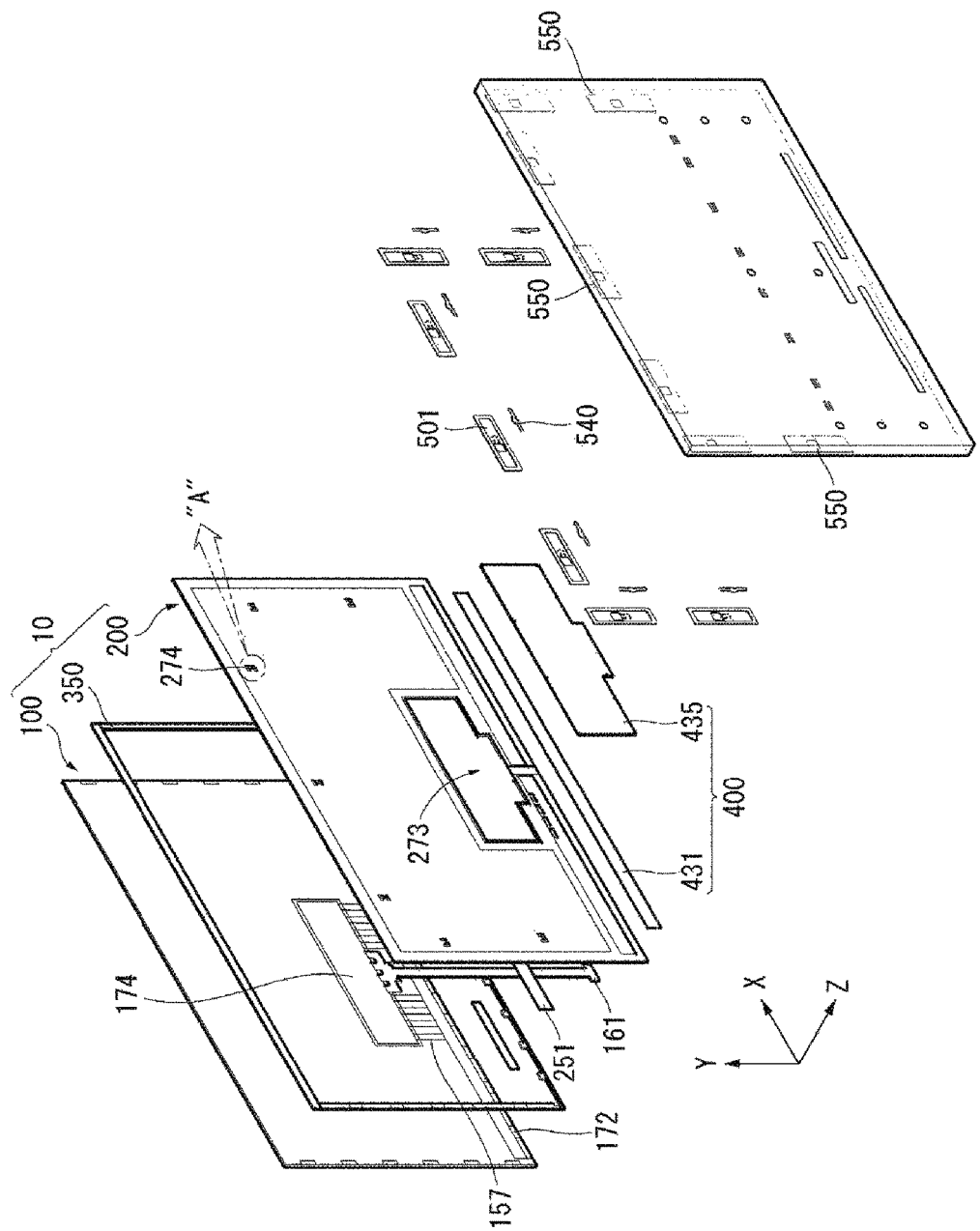
FIGS. 19 to 30 illustrate examples of a display device according to an embodiment of the disclosure.

Referring to FIG. 19, the module cover 200 can include one or more latches 274 on the rear surface of the module cover 200.

The latches 274 can be disposed along the edge of the module cover 200. One or more latches 274 can be spaced apart from each other at a predetermined distance.

The latch 274 can be disposed on the first long side LS1, the first short side SS1, and the second short side SS2 of the module cover 200.

A bracket 501 can be disposed in the rear of the display panel 100 or in the rear of the head 10. The bracket 501 can be fixed or fastened to a plate 600.

One or more brackets 501 can be spaced apart from each other. The brackets 501 can be extended along the upper side of the plate 600 or the first long side LS1 in the left-right direction X. Further, the brackets 501 can be extended along the side of the plate 600 or the first and second short sides SS1 and SS2 in the up-down direction Y.

A fixing pin 540 can be disposed between the bracket 501 and the plate 600 or between the bracket 501 and an adhesive member 550.

The adhesive member 550 can be disposed in the rear or the rear surface of the bracket 501. The adhesive member 550 can be disposed between the bracket 501 and the plate 600.

The adhesive member 550 can firmly attach and fix the bracket 501 to the plate 600. The adhesive member 550 can have substantially the same shape as a shape of a contact portion between the bracket 501 and the plate 600.

Figure 20:
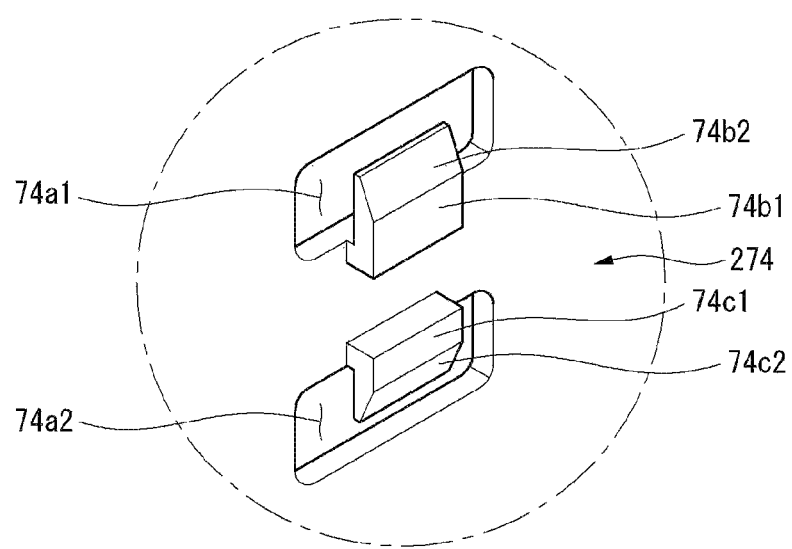
Figure 21:
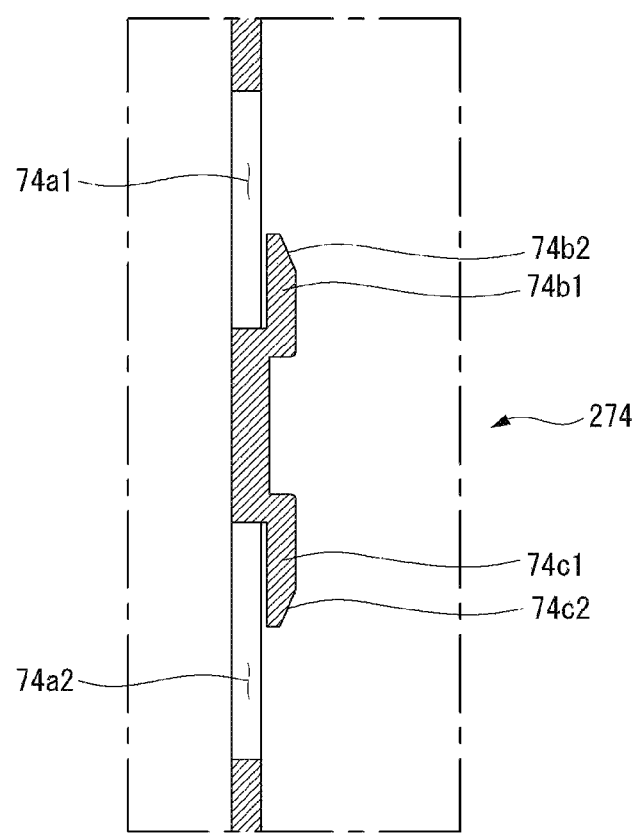

FIG. 20 is an enlarged view of a portion "A" of FIG. 19. Referring to FIGS. 20 and 21, the module cover 200 can include a plurality of latches 274 and a plurality of accommodating holes 74a1 and 74a2. The latches 274 can include a first latch 74b1 and a second latch 74c1 that face each other in opposite directions.

The accommodating holes 74a1 and 74a2 can include a first accommodating hole 74a1 and a second accommodating hole 74a2.

The first accommodating hole 74a1 can be recessed in a direction from the rear surface to the front surface of the module cover 200 or can penetrate the module cover 200.

The first accommodating hole 74a1 can be adjacent to the first latch 74b1 and can accommodate the fixing pin 540.

The first latch 74b1 can protrude from one side of the first accommodating hole 74a1. The one side of the first accommodating hole 74a1 can be a lower side of the first accommodating hole 74a1.

The first latch 74b1 can protrude in a direction from the front surface to the rear surface of the module cover 200 and can be bent in the opposite direction of the second latch 74c1 adjacent to the first latch 74b1. A thickness of the bent first latch 74b1 can gradually decrease. Namely, the first latch 74b1 can have an inclined surface 74b2 inclined in an oblique direction.

The second accommodating hole 74a2 can be spaced apart from the first latch 74b1 and the first accommodating hole 74a1, can be adjacent to the second latch 74c1, and can accommodate the fixing pin 540. The second accommodating hole 74a2 can be recessed in a direction from the rear surface to the front surface of the module cover 200 or can penetrate the module cover 200.

The second latch 74c1 can protrude from the other side of the second accommodating hole 74a2 close to the one side of the first accommodating hole 74a1. The other side of the second accommodating hole 74a2 can be an upper side of the second accommodating hole 74a2.

The second latch 74c1 can protrude in a direction from the front surface to the rear surface of the module cover 200 and can be bent in the opposite direction of the first latch 74b1 adjacent to the second latch 74c1. A thickness of the bent second latch 74c1 can gradually decrease. Namely, the second latch 74c1 can have an inclined surface 74c2 inclined in an oblique direction intersecting the oblique direction of the first latch 74b1.

The inclined surface 74c2 of the second latch 74c1 can be inclined in the opposite direction of the inclined surface 74b2 of the first latch 74b1.

Figure 22:
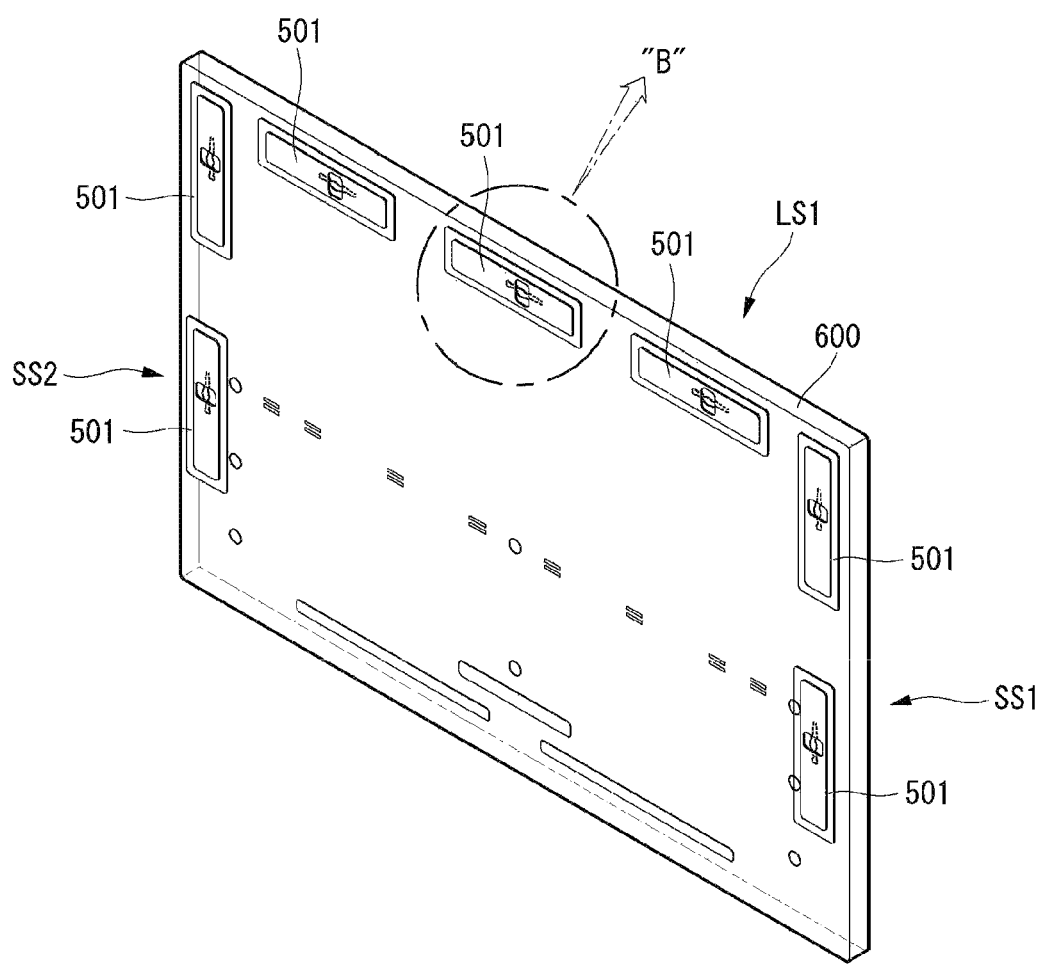
Figure 23:
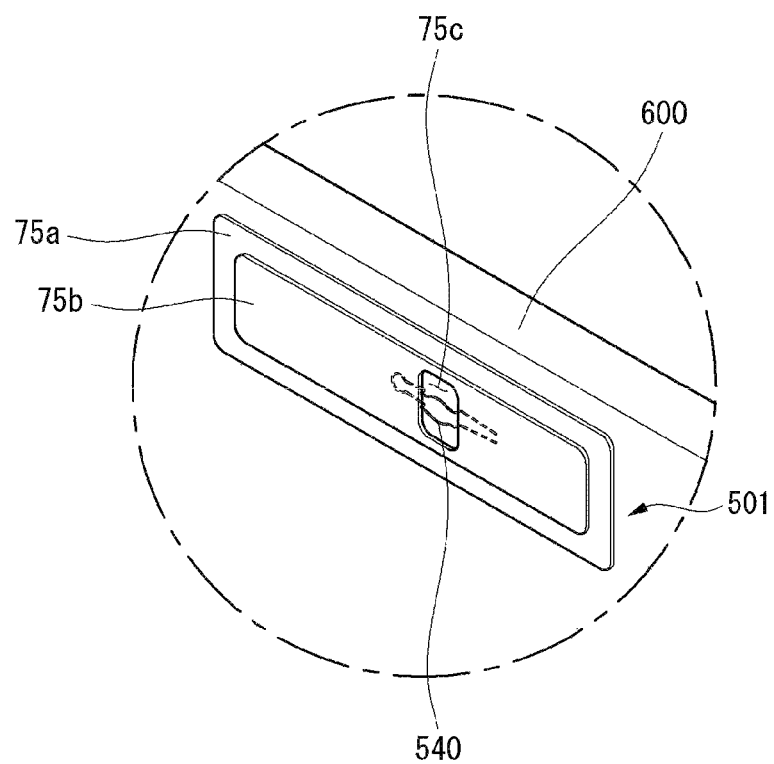

Referring to FIGS. 22 and 23, the plurality of brackets 501 can be spaced apart from one another on the plate 600. FIG. 23 is an enlarged view of a portion "B" of FIG. 22.

Some of the plurality of brackets 501 can be extended along the upper side of the plate 600 or the first long side LS1 in the left-right direction X. Further, the remaining brackets 501 can be extended along the side of the plate 600 or the first and second short sides SS1 and SS2 in the up-down direction Y.

Each bracket 501 can include a bracket body 75a, a pin housing 75b, and a pin hole 75c.

The bracket body 750a can be formed in a predetermined flat plate shape. For example, the bracket body 75a can have a rectangular shape. The bracket body 75a may be referred to as a body.

The pin housing 75b can be disposed on an upper surface of the bracket body 75a. The pin housing 75b can protrude from the upper surface of the bracket body 75a. The pin housing 75b can be recessed in a direction from a lower surface to the upper surface of the bracket body 75a. The pin housing 75b can provide an internal space.

The pin hole 75c can be disposed on an upper surface of the pin housing 75b. The pin hole 75c can be formed to penetrate the pin housing 75b.

The fixing pin 540 can be disposed in the internal space of the pin housing 75b. A portion of the fixing pin 540 can be exposed through the pin hole 75c.

Figure 24:
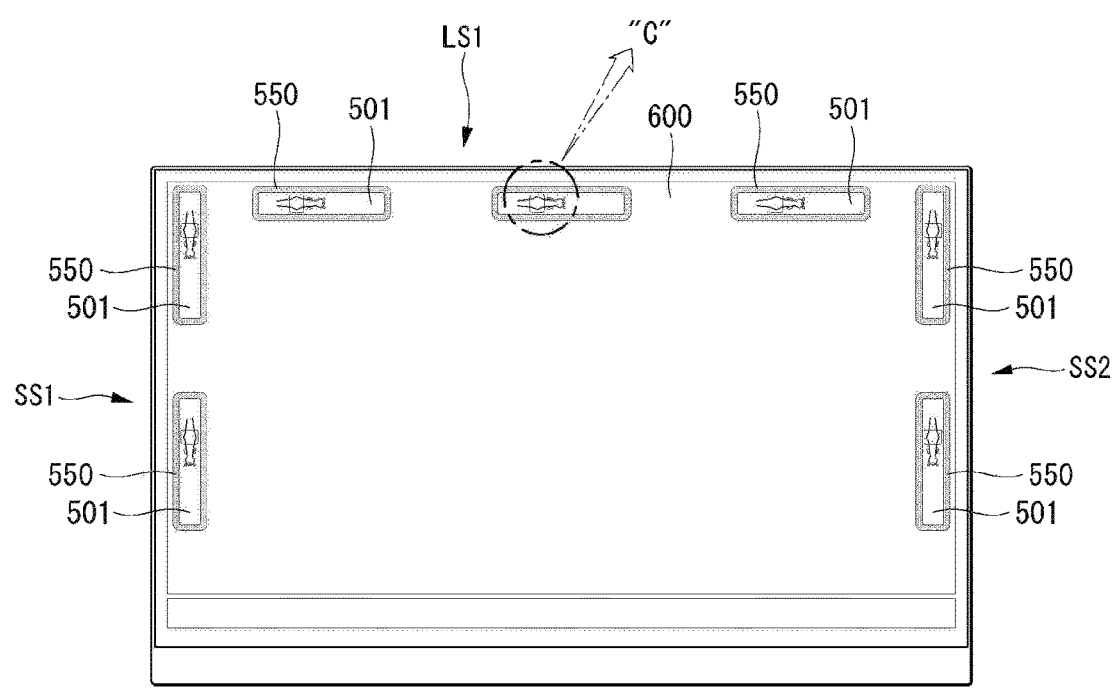

Referring to FIG. 24, the adhesive member 550 can be disposed in the rear or the rear surface of the bracket 501. The adhesive member 550 can be disposed in front or the front surface of the plate 600. The adhesive member 550 can be disposed between the bracket 501 and the plate 600.

The adhesive member 550 can be disposed along an edge of the lower surface of the bracket 501. The adhesive member 550 can have a frame shape and can be disposed on the lower surface of the bracket 501.

Figure 25:
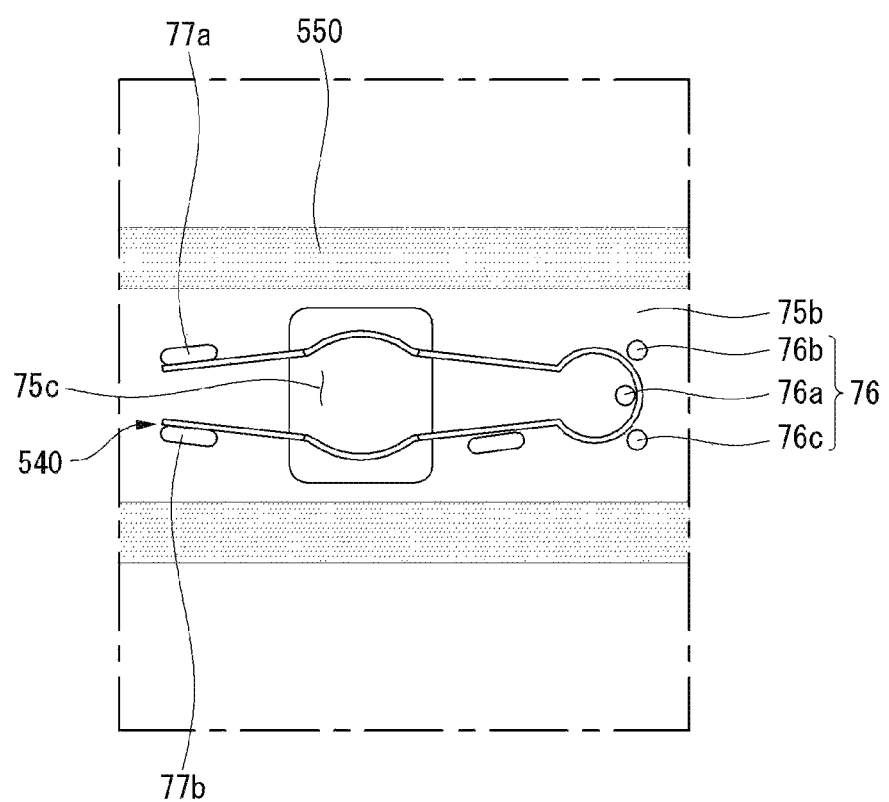

FIG. 25 is an enlarged view of a portion "C" of FIG. 24. Referring to FIG. 25, the adhesive member 550 can be adjacent to an internal space of the bracket 501. One or more pin fixing protrusions 76, 77a, and 77b can be formed in the internal space of the bracket 501. The pin fixing protrusions 76, 77a, and 77b can be disposed in the internal space of the bracket 501 and protrude toward the plate 600.

The pin fixing protrusions 76, 77a, and 77b can include first to fifth pin fixing protrusions 76a, 76b, 76c, 77a, and 77b.

The first pin fixing protrusion 76a can be formed in a cylindrical shape.

The second pin fixing protrusion 76b can be spaced apart from the first pin fixing protrusion 76a. The second pin fixing protrusion 76b can be formed in a cylindrical shape.

The third pin fixing protrusion 76c can be spaced apart from the first pin fixing protrusion 76a and the second pin fixing protrusion 76b. The first pin fixing protrusion 76a can be disposed between the second pin fixing protrusion 76b and the third pin fixing protrusion 76c.

The fourth pin fixing protrusion 77a can be spaced apart from the second pin fixing protrusion 76b. The fourth pin fixing protrusion 77a can be formed in a cylindroid shape. The pin hole 75c can be disposed between the second pin fixing protrusion 76b and the fourth pin fixing protrusion 77a.

The fifth pin fixing protrusion 77b can be spaced apart from the third pin fixing protrusion 76c and the fourth pin fixing protrusion 77a. For example, the fifth pin fixing protrusion 77b can be spaced apart from the third pin fixing protrusion 76c in a horizontal direction and spaced apart from the fourth pin fixing protrusion 77a in a vertical direction. The fifth pin fixing protrusion 77b can be formed in a cylindroid shape. The pin hole 75c can be disposed between the third pin fixing protrusion 76c and the fifth pin fixing protrusion 77b.

The fixing pin 540 can be disposed between the first to fifth pin fixing protrusions 76a, 76b, 76c, 77a, and 77b. The fixing pin 540 can be mounted in the internal space of the bracket 501 by the first to fifth pin fixing protrusions 76a, 76b, 76c, 77a, and 77b.

Figure 26:
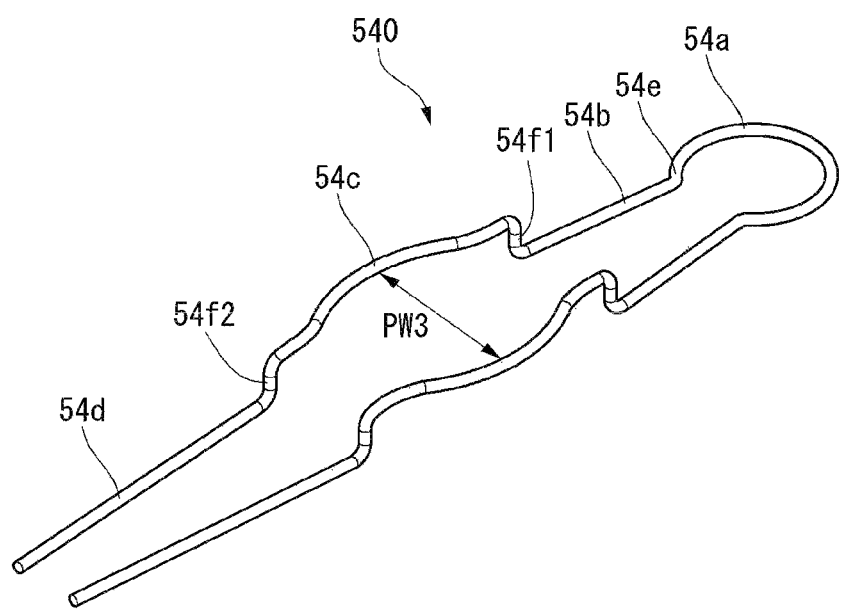

Referring to FIG. 26, the fixing pin 540 can include a pin elastic portion 54a, a pin transfer portion 54b, a pin fastening portion 54c, a pin support portion 54d, and pin connecting portions 54e, 54f1, and 54f2.

The pin elastic portion 54a can be accommodated in the internal space of the pin housing 75b and formed in a circular shape in which a portion is opened. The pin elastic portion 54a may be referred to as an elastic portion. The pin elastic portion 54a can have an elastic force that causes a modified shape to return to an original shape within an elastic range.

The pin transfer portions 54b can be accommodated in the internal space of the pin housing 75b and respectively extended from both ends of the opened portion of the pin elastic portion 54a. The pin transfer portion 54b may be referred to as a transfer portion. The pin transfer portion 54b can transfer the elastic force generated by the pin elastic portion 54a.

The first pin connecting portion 54e can be disposed between the pin elastic portion 54a and the pin transfer portion 54b. The first pin connecting portion 54e can connect the pin elastic portion 54a to the pin transfer portion 54b.

The pin fastening portion 54c can be extended from the pin transfer portion 54b. The pin fastening portion 54c may be referred to as a fastening portion. The pin fastening portion 54c is not accommodated in the internal space of the pin housing 75b. The pin fastening portions 54c can be respectively extended from the pin transfer portion 54b and the pin support portion 54d in a direction toward the plate 600 and can have a curved shape connecting the pin transfer portion 54b and the pin support portion 54d. A width PW3 between the pin fastening portions 54c may change. The width PW3 between the pin fastening portions 54c can gradually increase and then can gradually decrease. The width PW3 between the pin fastening portions 54c may be referred to as a third fastening width PW3.

The second pin connecting portion 54f1 can be disposed between the pin transfer portion 54b and the pin fastening portion 54c. The second pin connecting portion 54f1 can protrude from the pin transfer portion 54b in the vertical direction and can be connected to the pin fastening portion 54c.

The pin support portion 54d can be extended from the pin fastening portion 54c. The pin support portion 54d may be referred to as a support portion. The pin support portion 54*d* can support the fixing pin 540 during change in the third fastening width PW3.

The third pin connecting portion 54*f*2 can be disposed between the pin fastening portion 54*c* and the pin support portion 54*d*. The third pin connecting portion 5412 can protrude from the pin support portion 54*d* in the vertical direction and can be connected to the pin fastening portion 54*c*.

The pin fastening portion 54*c* can be formed higher than the pin elastic portion 54*a*, the pin transfer portion 54*b*, and the pin support portion 54*d* by a length of the second and third pin connecting portions 54*f*1 and 5412.

Figure 27:
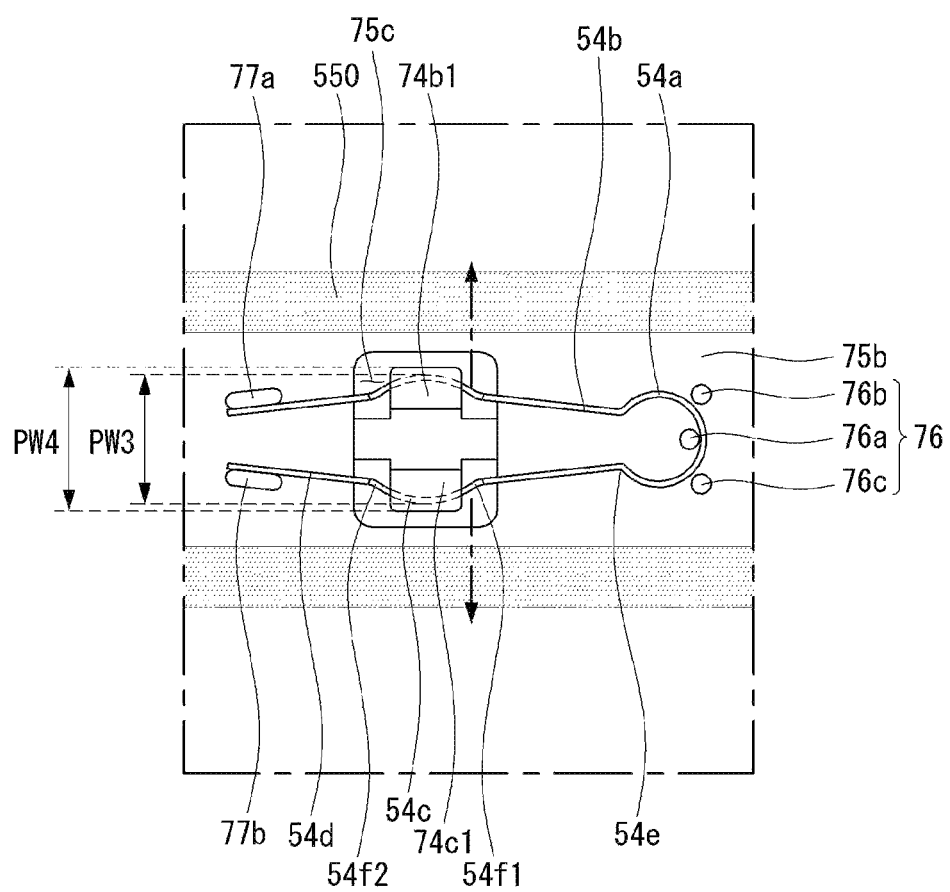

Referring to FIG. 27, the fixing pin 540 can be disposed between the first to fifth pin fixing protrusions 76*a*, 76*b*, 76*c*, 77*a*, and 77*b*. The first pin fixing protrusion 76*a* can be disposed inside the pin elastic portion 54*a* of the fixing pin 540. The second pin fixing protrusion 76*b* and the third pin fixing protrusion 76*c* can be disposed outside the pin elastic portion 54*a* of the fixing pin 540.

The pin elastic portion 54*a* of the fixing pin 540 can be disposed between the first pin fixing protrusion 76*a* and the second pin fixing protrusion 76*b* and between the first pin fixing protrusion 76*a* and the third pin fixing protrusion 76*c*.

The outside of the pin elastic portion 54*a* of the fixing pin 540 can be adjacent to the second pin fixing protrusion 76*b* and the third pin fixing protrusion 76*c*. The inside of the pin elastic portion 54*a* of the fixing pin 540 can be adjacent to the first pin fixing protrusion 76*a*.

The pin support portion 54*d* of the fixing pin 540 can be disposed between the fourth pin fixing protrusion 77*a* and the fifth pin fixing protrusion 77*b*. The outside of the pin support portion 54*d* of the fixing pin 540 can be adjacent to the fourth pin fixing protrusion 77*a* and the fifth pin fixing protrusion 77*b*.

The pin fastening portion 54*c* of the fixing pin 540 can be disposed higher than the opened pin hole 75*c*. The pin fastening portion 54*c* of the fixing pin 540 can protrude from the pin hole 75*c* and can be exposed to the outside.

The first and second latches 74*b*1 and 74*c*1 on the module cover 200 can be positioned opposite the fixing pin 540 on the bracket 501. The first and second latches 74*b*1 and 74*c*1 can approach the fixing pin 540. Alternatively, the fixing pin 540 can approach the first and second latches 74*b*1 and 74*c*1. Namely, the module cover 200 can approach the bracket 501.

The pin fastening portions 54*c* of the fixing pin 540 can face the inclined surfaces 74*b*2 and 74*c*2 of the first and second latches 74*b*1 and 74*c*1. The pin fastening portions 54*c* of the fixing pin 540 can continue to approach the first and second accommodating holes 74*a*1 and 74*a*2 along the inclined surfaces 74*b*2 and 74*c*2 of the first and second latches 74*b*1 and 74*c*1. Hence, the bracket 501 can be fastened to the module cover 200.

The third fastening width PW3 can increase as the pin fastening portions 54*c* approach the first and second accommodating holes 74*a*1 and 74*a*2 along the inclined surfaces 74*b*2 and 74*c*2 of the first and second latches 74*b*1 and 74*c*1. The third fastening width PW3 can be greater than a width PW4 between the first and second latches 74*b*1 and 74*c*1. The width PW4 between the first and second latches 74*b*1 and 74*c*1 can be expressed as a length measured from the end of the first latch 74*b*1 to the end of the second latch 74*c*1. The width PW4 between the first and second latches 74*b*1 and 74*c*1 may be referred to as a fourth fastening width.

The third fastening width PW3 can be greater than the fourth fastening width PW4 due to the elasticity of the pin elastic portion 54*a* of the fixing pin 540.

Figure 28:
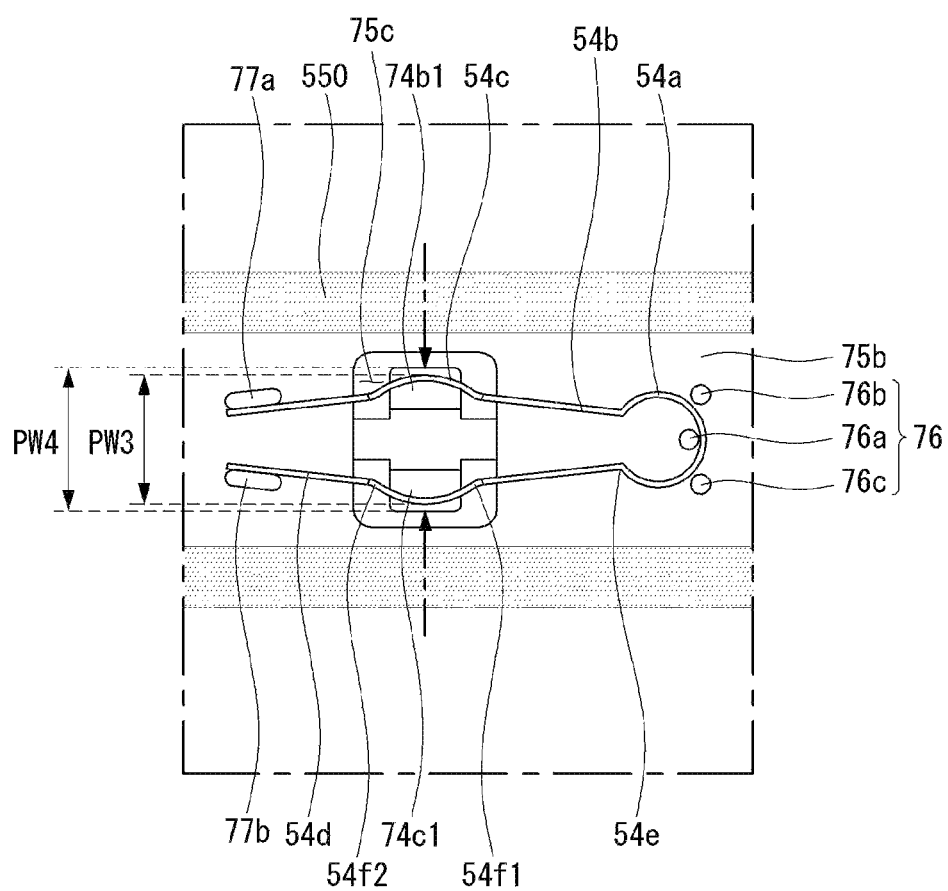

Referring to FIG. 28, the pin fastening portions 54*c* of the fixing pin 540 can pass the inclined surfaces 74*b*2 and 74*c*2 of the first and second latches 74*b*1 and 74*c*1 and can be inserted or positioned in the first and second accommodating holes 74*a*1 and 74*a*2. At the same time, the first and second latches 74*b*1 and 74*c*1 can be inserted or positioned in the pin hole 75*c*. The bracket 501 can be mounted on the module cover 200. The pin fastening portions 54*c* of the fixing pin 540 can overlap the first and second latches 74*b*1 and 74*c*1. The pin fastening portions 54*c* of the fixing pin 540 can be respectively inserted or positioned in the first and second accommodating holes 74*a*1 and 74*a*2 and can face the module cover 200. The first and second latches 74*b*1 and 74*c*1 can be inserted or positioned in the pin hole 75*c* and can face the plate 600.

When the pin fastening portions 54*c* of the fixing pin 540 are inserted or positioned in the first and second accommodating holes 74*a*1 and 74*a*2, the third fastening width PW3 can be maintained at an original width or an original distance less than the fourth fastening width PW4. The third fastening width PW3 can be restored to an original shape or an original position by the elasticity of the pin elastic portion 54*a* of the fixing pin 540.

The third fastening width PW3 can be maintained to be less than the fourth fastening width PW4 using the elasticity of the pin elastic portion 54*a* of the fixing pin 540. The module cover 200 can be firmly mounted on the plate 600.

When the fixing pin 540 on the bracket 501 is coupled with the latch 274 on the module cover 200, a width of the pin elastic portion 54*a* can increase and can be again restored to an original width or an original distance using the elasticity of the pin elastic portion 54*a*.

Figure 29:
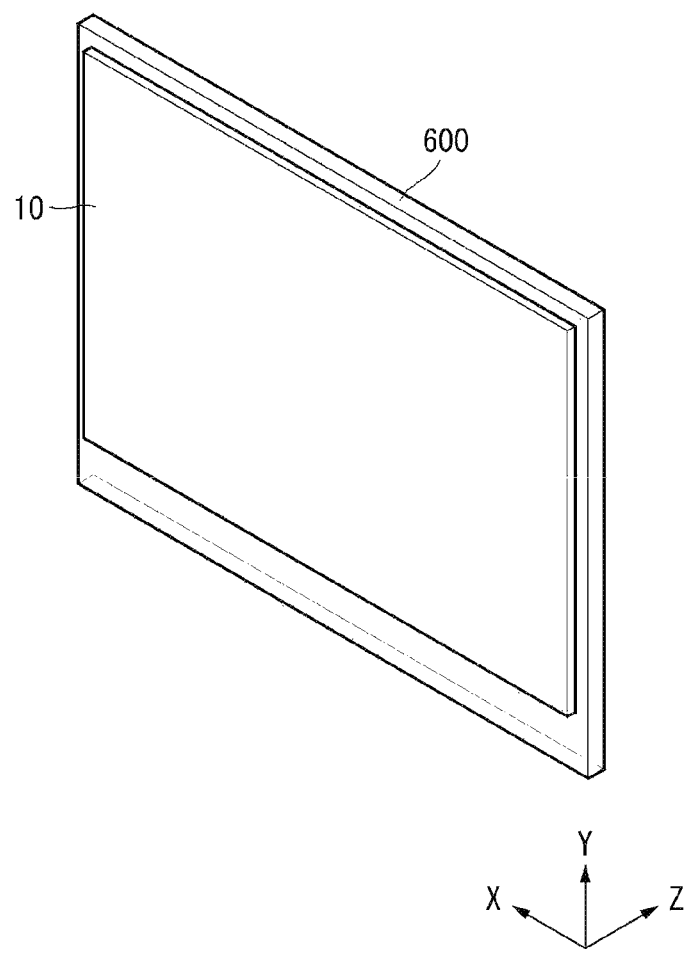
Figure 30:
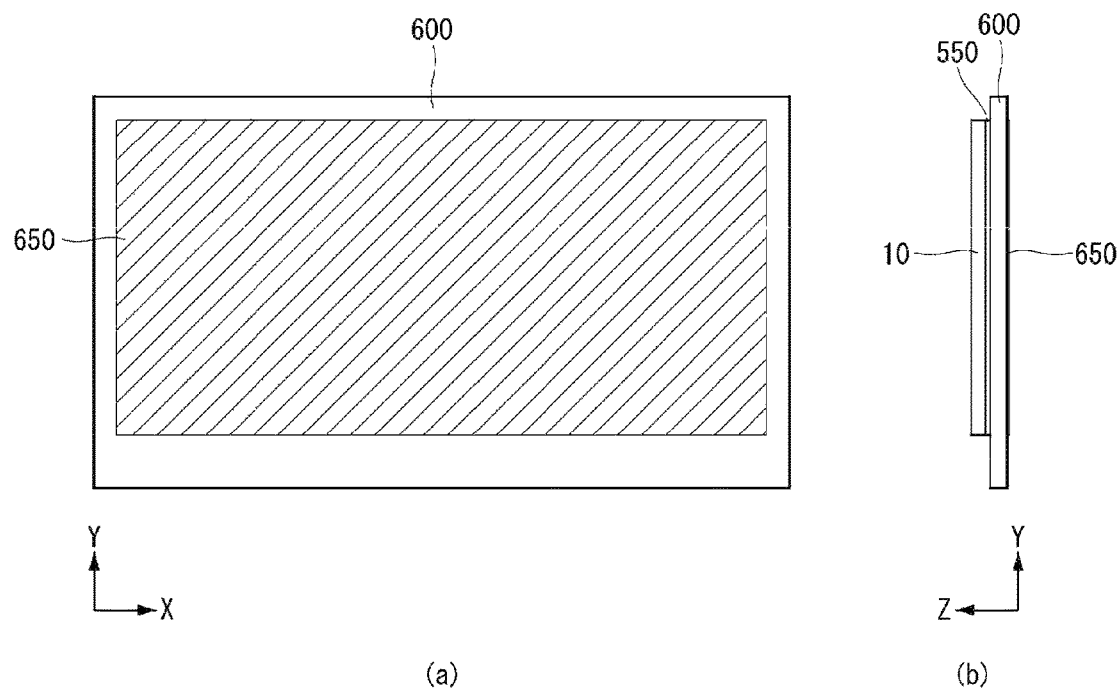

Referring to FIGS. 29 and 30, the head 10 can be fixed to the plate 600 using the latches 27*b*1 and 27*c*1 (see FIG. 18) or 74*b*1 and 74*c*1 (see FIG. 28) and the fixing pin 530 (see FIG. 18) or 540 (see FIG. 28).

A reinforced film 650 can be disposed on the rear surface of the plate 600. The reinforced film 650 on the rear surface of the plate 600 can protect the plate 600. For example, the reinforced film 650 can prevent scratches generated when the plate 600 moves or scratches generated by a collision between the plate 600 and an object. In addition, the reinforced film 650 can protect the plate 600 by distributing an external impact when the external impact is applied to the plate 600.

The reinforced film 650 can include an opaque material. The reinforced film 650 can shield an object seen in the rear of the plate 600 or light transmitted through the rear of the plate 600.

According to an embodiment, the fixing pin can provide flexibility and a certain amount of "give" during assembly when the module cover is coupled to the plate, which can help reduce breakage and facilitate assembly by also mitigating minor alignment issues.

The foregoing embodiments are merely examples and are not to be considered as limiting the present disclosure. The present teachings can be readily applied to other types of methods and apparatuses. The features, structures, methods, and other characteristics of the embodiments described herein can be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display panel;
   a module cover disposed at a rear of the display panel and coupled to the display panel;
   a plate disposed at a rear of the module cover;
   a bracket disposed between the module cover and the plate, and fixed to the plate; and
   a coupling unit fixing the bracket to the module cover,
   wherein the coupling unit includes:
      a latch disposed at a rear surface of the module cover; and
      a fixing pin mounted on the bracket and coupled to the latch,
   wherein the latch includes:
      a first latch and a second latch that face each other; and
      an accommodating recess disposed between the first latch and the second latch and accommodating the fixing pin,
   wherein the bracket includes:
      a body;
      a pin housing disposed between the body and the plate, and including a recessed surface of the body; and
      a pin hole penetrating the pin housing, and
   wherein the fixing pin is disposed in an internal space of the pin housing, and a portion of the fixing pin is exposed by the pin hole.

2. The display device of claim 1, wherein the pin housing includes a plurality of pin fixing protrusions in the internal space of the pin housing, and
   wherein the fixing pin is adjacent to the plurality of pin fixing protrusions and is mounted in the internal space of the pin housing.

3. The display device of claim 1, wherein the first latch and the second latch are disposed in the pin hole.

4. The display device of claim 1, wherein the fixing pin includes:
   an elastic portion accommodated in the internal space of the pin housing and having a circular shape at one side of the fixing pin with an open portion that extends to an opposite side of the fixing pin;
   a transfer portion accommodated in the internal space of the pin housing and extended from both ends of the open portion of the elastic portion; and
   a fastening portion extended from the transfer portion in a direction toward the module cover, wherein the fastening portion is not accommodated in the internal space of the pin housing.

5. The display device of claim 4, wherein the fastening portion includes one or more bends.

6. The display device of claim 4, wherein the fastening portion is disposed adjacent to the accommodating recess in the latch.

7. The display device of claim 4, wherein the bracket is mounted on the module cover, and a width of the fastening portion is greater than a width between an end of the first latch and an end of the second latch.

8. A display device comprising:
   a display panel;
   a module cover disposed at a rear of the display panel and coupled to the display panel;
   a plate disposed at a rear of the module cover;
   a bracket disposed between the module cover and the plate, and fixed to the plate; and
   a coupling unit fixing the bracket to the module cover,
   wherein the coupling unit includes:
      a latch disposed at a rear surface of the module cover; and
      a fixing pin mounted on the bracket and coupled to the latch,
   wherein the latch includes a first latch and a second latch that face away from each other in opposite directions,
   wherein the module cover includes:
      a first accommodating recess disposed adjacent to the first latch and accommodating the fixing pin; and
      a second accommodating recess spaced apart from the first latch and the first accommodating recess, disposed adjacent to the second latch, and accommodating the fixing pin,
   wherein the first latch and the second latch are disposed between the first accommodating recess and the second accommodating recess,
   wherein the bracket includes:
      a body;
      a pin housing disposed between the body and the plate, and including a recessed surface of the body; and
      a pin hole penetrating the pin housing, and
   wherein the fixing pin is disposed in an internal space of the pin housing, and a portion of the fixing pin is exposed by the pin hole.

9. The display device of claim 8, wherein the pin housing includes a plurality of pin fixing protrusions in the internal space of the pin housing, and
   wherein the fixing pin is adjacent to the plurality of pin fixing protrusions and is mounted in the internal space of the pin housing.

10. The display device of claim 8, wherein the pin housing includes a plurality of pin fixing protrusions in the internal space of the pin housing, and
    wherein the fixing pin includes:
       an elastic portion accommodated in the internal space of the pin housing and having a circular shape with an open portion;
       a transfer portion accommodated in the internal space of the pin housing and extended from both ends of the open portion of the elastic portion;
       a support portion accommodated in the internal space of the pin housing, spaced apart from the transfer portion and friction fit between at least two fixing protrusions among the plurality of fixing protrusions; and a fastening portion extended from the transfer portion and the support portion in a direction toward the plate and having a curved shape connecting the transfer portion and the support portion, wherein the fastening portion is not accommodated in the internal space of the pin housing.

11. The display device of claim 10, wherein the fastening portion is disposed adjacent to the first accommodating recess and the second accommodating recess.

12. The display device of claim 10, wherein the bracket is mounted on the module cover, and a width of the fastening portion is less than a width between an end of the first latch and an end of the second latch.

13. The display device of claim 1, further comprising an adhesive member fixed to a front surface of the plate and attached to the bracket.

14. A display device comprising:
a display panel;
a module cover disposed at a rear of the display panel and coupled to the display panel;
a plate disposed at a rear of the module cover;
a bracket disposed between the module cover and the plate, and fixed to the plate; and
a coupling unit fixing the bracket to the module cover, wherein the coupling unit includes:
a latch disposed at a rear surface of the module cover; and
a fixing pin mounted on the bracket and coupled to the latch,
wherein the latch includes:
a first latch with a first inclined portion; and
a second latch with a second inclined portion,
wherein portions of the fixing pin overlap with the first and second inclined portions of the first and second latches to couple the module cover to the plate, and
wherein the first and second inclined portions of the first and second latches are configured to allow the fixing pin to pass from a position in front of the first and second inclined portions to a position under the first and second latches to snap couple the plate and the module cover together.

15. The display device of claim 14, wherein the first and second inclined portions of the first and second latches face toward each other, and the first and second latches are separated by a distance that is less than a width of the fixing pin.

16. The display device of claim 14, wherein the first and second inclined portions of the first and second latches face away from each other, and a distance between an outer edge of the first latch and an outer edge of the second latch is greater than a width of the fixing pin.

* * * * *